(12) United States Patent
Hu et al.

(10) Patent No.: US 11,705,196 B2
(45) Date of Patent: Jul. 18, 2023

(54) AUTO-CALIBRATING CROSSBAR-BASED APPARATUSES

(71) Applicant: TetraMem Inc., Newark, CA (US)

(72) Inventors: Miao Hu, San Jose, CA (US); Ning Ge, Danville, CA (US)

(73) Assignee: TetraMem Inc., Fremont, CA (US)

( * ) Notice: Subject to any disclaimer, the term of this patent is extended or adjusted under 35 U.S.C. 154(b) by 198 days.

(21) Appl. No.: 17/196,502

(22) Filed: Mar. 9, 2021

(65) Prior Publication Data

US 2022/0293173 A1 Sep. 15, 2022

(51) Int. Cl.
  *G11C 11/00* (2006.01)
  *G11C 13/00* (2006.01)
  *G06F 9/30* (2018.01)

(52) U.S. Cl.
  CPC ...... *G11C 13/0069* (2013.01); *G06F 9/30036* (2013.01); *G06F 9/30101* (2013.01)

(58) Field of Classification Search
  CPC . G11C 3/0069; G11C 2213/77; G11C 13/003; G11C 13/004; G06F 9/30036; G06F 9/30101
  See application file for complete search history.

(56) References Cited

U.S. PATENT DOCUMENTS

| | | |
|---|---|---|
| 9,659,249 B1 | 5/2017 | Copel |
| 10,802,994 B1 | 10/2020 | Ge |
| 2002/0097081 A1 | 7/2002 | Razavi |
| 2008/0307151 A1 | 12/2008 | Mouttet |
| 2013/0229864 A1* | 9/2013 | Conte ............... G11C 13/0069 365/163 |
| 2015/0170025 A1 | 6/2015 | Wu |
| 2018/0253643 A1* | 9/2018 | Buchanan ............ G06F 7/5443 |
| 2019/0189174 A1 | 6/2019 | Hu |
| 2020/0234763 A1* | 7/2020 | Ge ....................... H03F 3/45475 |
| 2022/0005526 A1* | 1/2022 | Hu ..................... G11C 13/0069 |

OTHER PUBLICATIONS

PCT Search Report and Written Opinion for PCT/US22/72117, dated Aug. 1, 2022, 7 pages.

\* cited by examiner

*Primary Examiner* — Hien N Nguyen
(74) *Attorney, Agent, or Firm* — Jaffery Watson Mendonsa & Hamilton LLP

(57) ABSTRACT

Aspects of the present disclosure provide a method for calibrating crossbar-based apparatuses. The method includes obtaining output data of a crossbar-based apparatus may include a plurality of cross-point devices with tunable conductance, where the output data of the crossbar-based apparatus represents computing results of at least one operation performed by the crossbar-based apparatus, and where the output data corresponding to a plurality of settings of a plurality of analog components of the crossbar-based apparatus. The method also includes obtaining, by a processing device, one or more calibration parameters based on the output data of the crossbar-based apparatus, where the one or more calibration parameters correspond to one or more errors associated with one or more of the analog components of the crossbar-based apparatus. The method further includes calibrating the crossbar-based apparatus using the one or more calibration parameters.

20 Claims, 13 Drawing Sheets

AUTO-CALIBRATING CROSSBAR-BASED APPARATUSES

TECHNICAL FIELD

This disclosure relates to the field of computing systems and, in particular, to auto-calibration of crossbar-based apparatuses.

BACKGROUND

A crossbar circuit may refer to a circuit structure with interconnecting electrically conductive lines sandwiching a resistive switching material at their intersections. The resistive switching material may include, for example, a memristor (also referred to as resistive random-access memory (RRAM or ReRAM)). Crossbar circuits may be used to implement in-memory computing applications, non-volatile solid-state memory, image processing applications, neural networks, etc.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

One or more aspects of the present disclosure provide for methods for calibrating a crossbar-based apparatus. The methods include obtaining output data of a crossbar-based apparatus comprising a plurality of cross-point devices with tunable conductance, wherein the output data of the crossbar-based apparatus represents computing results of at least one operation performed by the crossbar-based apparatus, and wherein the output data corresponding to a plurality of settings of a plurality of analog components of the crossbar-based apparatus. In some embodiments, the methods further include obtaining, by a processing device, one or more calibration parameters based on the output data of the crossbar-based apparatus, wherein the one or more calibration parameters correspond to one or more errors associated with one or more of the analog components of the crossbar-based apparatus. The methods further include, calibrating the crossbar-based apparatus using the one or more calibration parameters to compensate for deviations of the computing results of the at least one operation performed by the crossbar-based apparatus from expected results of the at least one operation.

In some embodiments, the output data of the crossbar-based apparatus corresponds to a conductance pattern of the cross-point devices, wherein the conductance pattern comprises conductance values of the cross-point devices. In some embodiments, obtaining, by the processing device, the one or more calibration parameters includes: determining a plurality of error parameters approximating the errors associated with the one or more of the analog components of the crossbar-based apparatus; and generating the one or more calibration parameters based on the error parameters.

In some embodiments, determining the plurality of error parameters approximating the errors associated with the one or more of the analog components of the crossbar-based apparatus includes: generating simulated output data based on an error model; and minimizing a difference between the output data and the simulated output data.

In some embodiments, generating the one or more calibration parameters based on the error parameters further includes: calibrating the simulated output data to generate calibrated simulated output data; and minimizing a difference between the calibrated simulated output and expected output data representative of the expected results of the at least one operation performed by the crossbar-based apparatus.

In some embodiments, the input data may include the plurality of settings of the plurality of analog components of the crossbar-based apparatus.

In some embodiments, the methods further include generating the expected output data by processing the input data using a system model. The input data further comprises a calibrated conductance pattern.

In some embodiments, the at least one operation comprises at least one of a read operation, a vector-matrix multiplication (VMM) operation, or a neural processing operation. The one or more errors comprise at least one of a voltage offset or a gain error.

In some embodiments, the plurality of analog components of the crossbar-based apparatus includes at least one of an operational amplifier (op-amp), an analog-to-digital converter (ADC), a digital-to-analog converter (DAC), or a transimpedance amplifier (TIA).

In some embodiments, calibrating the crossbar-based apparatus may include storing the calibration parameters in one or more circuit registers of the crossbar-based apparatus.

One or more aspects of the present disclosure provide for a system for calibrating crossbar-based apparatuses. In some embodiments, the system may include a memory and a processing device operatively coupled to the memory. The processing device is configured to: obtain output data of a crossbar-based apparatus comprising a plurality of cross-point devices with tunable conductance, wherein the output data of the crossbar-based apparatus represents computing results of at least one operation performed by the crossbar-based apparatus, and wherein the output data corresponding to a plurality of settings of a plurality of analog components of the crossbar-based apparatus; obtain, by the processing device, one or more calibration parameters based on the output data of the crossbar-based apparatus, wherein the one or more calibration parameters correspond to one or more errors associated with one or more of the analog components of the crossbar-based apparatus; and calibrate the crossbar-based apparatus using the one or more calibration parameters to compensate for deviations of the computing results of the at least one operation performed by the crossbar-based apparatus from expected results of the at least one operation.

In some embodiments, to obtain the one or more calibration parameters, the processing device is further to: determine a plurality of error parameters approximating the errors associated with the one or more of the analog components of the crossbar-based apparatus; and generate the one or more calibration parameters based on the error parameters.

In some embodiments, to determine the plurality of error parameters approximating the errors associated with the one or more of the analog components of the crossbar-based apparatus, the processing device is further to: generate simulated output data based on an error model; and minimize a difference between the output data and the simulated output data.

In some embodiments, to generate the one or more calibration parameters based on the error parameters, the processing device is further to: calibrate the simulated output data to generate calibrated simulated output data; and minimize a difference between the calibrated simulated output and expected output data representative of the expected results of the at least one operation performed by the crossbar-based apparatus.

In some embodiments, the processing device is further to generate the simulated output data by processing input data using the error model, wherein the input data comprises the plurality of settings of the plurality of analog components of the crossbar-based apparatus.

One or more aspects of the present disclosure provide for a non-transitory machine-readable storage medium. The non-transitory machine-readable storage medium includes instructions that, when accessed by a processing device, cause the processing device to: obtain output data of a crossbar-based apparatus comprising a plurality of cross-point devices with tunable conductance, wherein the output data of the crossbar-based apparatus represents computing results of at least one operation performed by the crossbar-based apparatus, and wherein the output data corresponding to a plurality of settings of a plurality of analog components of the crossbar-based apparatus; obtain, by the processing device, one or more calibration parameters based on the output data of the crossbar-based apparatus, wherein the one or more calibration parameters correspond to one or more errors associated with one or more of the analog components of the crossbar-based apparatus; and calibrate the crossbar-based apparatus using the one or more calibration parameters to compensate for deviations of the computing results of the at least one operation performed by the crossbar-based apparatus from expected results of the at least one operation.

BRIEF DESCRIPTION OF THE DRAWINGS

The present disclosure is illustrated by way of example, and not by way of limitation, in the figures of the accompanying drawings.

DETAILED DESCRIPTION

Figure 1:
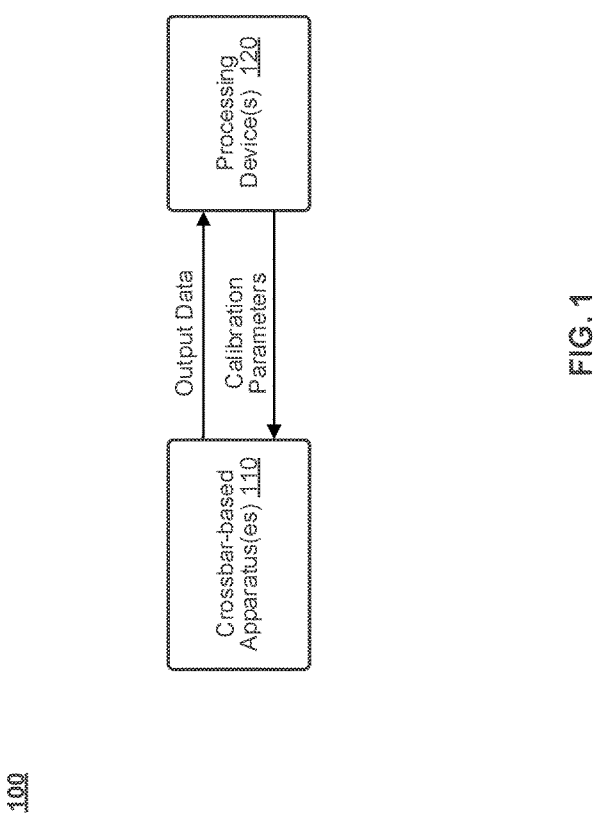
FIG. 1 illustrates an example of a system for calibrating crossbar-based apparatuses in accordance with one implementation of the disclosure.

A crossbar array may include a plurality of interconnecting electrically conductive wires (e.g., metal wires) and cross-point devices formed at each row-column intersection. Each of the cross-point devices may be a device with tunable resistance, such as a memristor (also referred to as resistive random-access memory (RRAM or ReRAM)), phase-change memory (PCM) devices, floating gates, spintronic devices, static random-access memory (SRAM), etc. A computing device (e.g., a chip) including one or more crossbar arrays may be referred to as a crossbar-based apparatus. The crossbar-based apparatus may be used to implement in-memory computing applications.

The crossbar-based apparatus may further include other analog components, such as one or more digital-to-analog converters (DACs), analog-to-digital converters (ADCs), transimpedance amplifiers (TIAs), transistors, etc. for providing desirable outputs. The actual behavior of the analog components may deviate from the expected behavior of the analog components. Such deviation may result in deviations of the actual output of the crossbar-based apparatus from the expected output of the crossbar-based apparatus. When multiple such crossbar-based apparatuses are used to implement a system, errors in the output of each of the crossbar-based apparatuses may propagate through the system and may result in non-negligible errors in the output of the system. Accordingly, calibration of the crossbar-based apparatus may be required to achieve desired performance of the computing device.

Prior solutions for calibrating crossbar-based apparatuses typically involve testing and calibrating a specific analog component utilizing a calibration circuit that may provide a reference configuration parameter (e.g., a reference voltage). While the crossbar-based apparatus is calibrated utilizing the calibrating circuit, the crossbar-based apparatus cannot perform operations as designed. Calibrating multiple analog components may require multiple such calibration circuits, each specific to a particular analog component. As such, calibrating crossbar-based apparatuses using the prior solutions is not cost-effective. It would be extremely challenging if not possible to calibrate a system comprising a tremendous number of crossbar-based apparatuses (e.g., a neural network implemented using hundreds or thousands of crossbar arrays) using the prior solutions.

Aspects of the present disclosure address the above and other deficiencies of the prior solutions by providing mechanisms for calibrating crossbar-based apparatuses. In some embodiments, a crossbar-based apparatus may be powered up. The crossbar-based apparatus may be set to a certain conductance pattern (e.g., by programming one or more of cross-point devices of the crossbar-based apparatus to specific conductance values). The crossbar-based apparatus may be further set to a plurality of settings. Each of the settings may include configuration parameters (e.g., a reference voltage, a gain) of one or more analog components of the crossbar-based apparatus (e.g., DAC, ADC, TIA). Outputs of the crossbar-based apparatuses with the settings may be obtained. Each of the outputs may represent a computing result of the operation performed by the crossbar-based apparatus with one of the settings.

The outputs may be provided to a processing device for processing. The processing device may generate calibration parameters to compensate for deviations of the computing results from expected results of the operation performed by the crossbar-based apparatus. The processing device may then provide the calibration parameters to the crossbar-based apparatus. The calibration parameters may be stored in one or more circuit registers of the crossbar-based apparatus.

In some embodiments, to generate the calibration parameters, the processing device may generate simulated results representative of estimated values of the computing results using an error model. The processing device may further generate calibrated simulated results by calibrating the simulated results using one or more calibration parameters. The processing device may obtain the calibration parameters by fitting the calibrated simulated results to the expected results and fitting the simulated results to the computing results.

As such, the mechanisms of the present disclosure may be used to calibrate crossbar-based apparatuses without requiring additional testing and/or calibration circuitry. The calibration processes described herein may be regarded as being automatic given that the processing device may determine the optimized calibration parameters based on input data including the computing results and expected results of the operation performed by the crossbar-based apparatus without human intervention. The mechanisms may also calibrate a crossbar-based apparatus while the crossbar-based apparatus is operating in an ordinary fashion. The calibration parameters generated in accordance with the present disclosure may be embedded in configurations of the analog components of the crossbar-based apparatuses. The auto-calibration of the crossbar-based apparatus may further improve the computation accuracy of the crossbar-based apparatus and avoid saturation issues. The mechanisms described herein may be used to calibrate a system comprising multiple crossbar-based apparatuses (e.g., a neural network implemented using multiple crossbar chips). The crossbar-based apparatuses may be calibrated in a cost-effective manner sequentially and/or in parallel using the mechanisms described herein. The calibrated crossbar-based apparatuses may output computation results as designed.

FIG. 1 illustrates an example of a system 100, in accordance with one implementation of the disclosure, for calibrating crossbar-based apparatuses. System 100 may include one or more crossbar-based apparatuses 110 and one or more processing devices 120.

Crossbar-based apparatus 110 may include one or more crossbar arrays. Each of the crossbar arrays may include a plurality of horizontal wires and vertical wires, such as one or more row wires, column wires, etc. The crossbar array may further include one or more cross-point devices formed at the intersections of the row wires and column wires. Each of the cross-point devices may be a device with tunable resistance, such as a memristor, phase-change memory (PCM) devices, floating gates, spintronic devices, resistive random-access memory (RRAM), static random-access memory (SRAM), etc. In some embodiments, the cross-point device may be and/or include a circuit structure of one-transistor-one-memristor (1T1M), a one-selector-one-resistor (1S1R) structure, a two-resistor (2R) structure, etc. In some embodiments, crossbar-based apparatus 110 may include one or more crossbar arrays as described in connection with FIG. 2.

In some embodiments, crossbar-based apparatus may be configured to perform one or more operations. For example, crossbar-based apparatus 110 may perform a read operation. More particularly, for example, an input signal may be applied to one or more rows of crossbar-based apparatus 110. An output signal may be outputted from the columns of crossbar-based apparatus 110. In some embodiments, the input signal may include a voltage signal V. The output signal may include a current signal I. The relationship between the input signal and the output signal may be represented as I=VG, wherein G represents a conductance pattern of crossbar-based apparatus 110 (e.g., the conductance of the cross-point devices of crossbar-based apparatus 110).

As another example, crossbar-based apparatus may be configured to perform vector-matrix multiplication (VMM). A VMM operation may be represented as Y=XA, wherein each of Y, X, A represents a respective matrix. More particularly, for example, input vector X may be mapped to the input voltage V of crossbar-based apparatus 110. Matrix A may be mapped to conductance pattern G. The output current I may be read and mapped back to output results Y.

As a further example, crossbar-based apparatus 110 may be configured as a neural processing unit (NPU) that performs neural processing operations. For example, crossbar-based apparatus 110 may be configured to implement a portion of a neural network by performing VMMs corresponding to a Softmax function, a Rectified Linear Unit (ReLU) function, pooling function, batch function, linear function, etc.

Processing device 120 may include any suitable hardware, firmware, software, etc., for calibrating crossbar-based apparatus(es) 110 in accordance with the present disclosure. In some embodiments, processing device 120 may be and/or include one or more computer systems 1100 of FIG. 11. In some embodiments, processing device 120 may include one or more processing devices 300 and one or more components of processing device 300 as described in connection with FIG. 3.

Crossbar-based apparatus(es) 110 and processing device 120 may be communicatively connected in any suitable manner. In one implementation, crossbar-based apparatus(es) 110 and processing device(s) 120 may be connected via a network (not shown in FIG. 1). The network may include a public network (e.g., the Internet), a private network (e.g., a local area network (LAN) or wide area network (WAN)), a wired network (e.g., Ethernet network), a wireless network (e.g., an 802.11 network or a Wi-Fi network), a cellular network (e.g., a Long-Term Evolution (LTE) network), routers, hubs, switches, server computers, and/or a combination thereof. In another implementation, crossbar-based apparatus(es) 110 and processing device(s) 120 may be directly connected.

To calibrate one or more portions of crossbar-based apparatus 110, crossbar-based apparatus 110 may be powered up. Crossbar-based apparatus 110 may then be set to a certain conductance pattern (e.g., a predetermined conductance pattern, a random conductance pattern). The conductance pattern may include conductance values of the cross-point devices of crossbar-based apparatus 110. In one implementation, a signal cross-point device may be activated for calibration. In another implementation, multiple cross-point devices of crossbar-based apparatus 110 may be activated for calibration (e.g., by selecting one or more row switches and/or column switches controlling the cross-point devices). In a further implementation, all of the cross-point devices may be activated for calibration.

Crossbar-based apparatus 110 may be configured based on a plurality of settings. The settings may include, for example, configuration parameters of one more analog components of crossbar-based apparatus 110. More particularly, for example, the analog components of crossbar-based apparatuses may be set to a plurality of gains, references voltages, etc. An input signal may be applied to crossbar-based apparatus 110 with each of the settings. Crossbar-based apparatus 110 may process the input signal by performing an operation based on the input signal (e.g., a read operation, VMM operation, neural processing operation). Output data of crossbar-based apparatus 110 corresponding to each of the settings may be read. The output data may correspond to computing results (e.g., actual results) of the one or more operations performed by crossbar-based apparatus 110. Crossbar-based apparatus 110 may provide the output data to processing device 120 for processing.

Processing device 120 may receive the output data of crossbar-based apparatus 110 and generate calibration parameters for calibrating crossbar-based apparatus 110 based on the output data. The calibration parameters may correspond to errors associated with one or more analog components of crossbar-based apparatus 110. Examples of the errors may include one or more gain errors, voltage offsets, resistance errors, etc. Examples of the analog components include an operational amplifier (op-amp), transimpedance amplifier (TIA), digital-to-analog converter (DAC), analog-to-digital converter (ADC), transistor, cross-point device, etc.

As an example, processing device 120 may obtain input data including the settings of crossbar-based apparatus 110. Processing device 120 may process the input data using a first system model to generate expected results of the one or more operations performed by crossbar-based apparatus 110. The first system model may represent the expected behavior of crossbar-based apparatus 110. Processing device 120 may further process the input data using a second system model to generate simulated results of the one or more operations performed by crossbar-based apparatus 110. The second system model may represent the actual behavior of crossbar-based apparatus 110. As such, the simulated results may be and/or include estimated values of the computing results of crossbar-based apparatus 110 (e.g., the actual outputs read from crossbar-based apparatus 110).

Processing device 120 may calibrate the simulated results using one or more initial calibration parameters to generate calibrated simulated results. The initial calibration parameters may correspond to estimated values of the errors associated with the analog components of crossbar-based apparatus 110. Processing device 120 may then compare the calibrated simulated results and the expected results of the one or more operations performed by crossbar-based apparatus 110. Processing device 120 may update the initial calibration parameters to fit the calibrated simulated results to the expected results (e.g., by determining the calibration parameters to minimize a difference between the calibrated simulated results and the expected results).

Processing device 120 may update the second system model dynamically while generating the calibration parameters. For example, processing device 120 may compare the computing results and the simulated results of the one or more operations performed by crossbar-based apparatus 110. Processing device 120 may update the error parameters and/or the second system model to fit the simulated results to the computing results. For example, processing device 120 may determine whether a difference between the computing results and the simulated results is minimized. In response to determining that the difference is not minimized, processing device 120 may update the second system model by incorporating updated error parameters. The updated second system model may be used to generate updated simulated results. The updated simulated results may then be calibrated to generate updated values of the calibrated simulated results. Processing device 120 may then determine whether the difference between the expected results and the calibrated simulated results is minimized by comparing the updated values of the calibrated simulated results and the expected results.

Processing device 120 may update the calibration parameters and the error parameters iteratively as described above to find the calibration parameters that may minimize the difference between the calibrated simulated results and the expected results. Processing device 120 may provide the calibration parameters to crossbar-based apparatus 110. In some embodiments, processing device 120 may also generate a calibrated conductance pattern for crossbar-based apparatus 110. The calibrated conductance pattern may include conductance values of the cross-point devices. The calibrated conductance pattern may be generated, for example, by performing one or more operations as described in connection with FIG. 10.

Crossbar-based apparatus 110 may store the calibration parameters in one or more of its circuit registers. Crossbar-based apparatus 110 may be calibrated using the calibration parameters so that the deviations of the computing results from the expected results may be compensated and/or minimized. For example, the analog components of crossbar-based apparatus 110 may be configured based on the calibration parameters to compensate for voltage offsets, gain errors, and/or any other errors associated with the analog components. As another example, the cross-point devices of crossbar-based apparatus 110 may be tuned to the calibrated conductance pattern.

Figure 2:
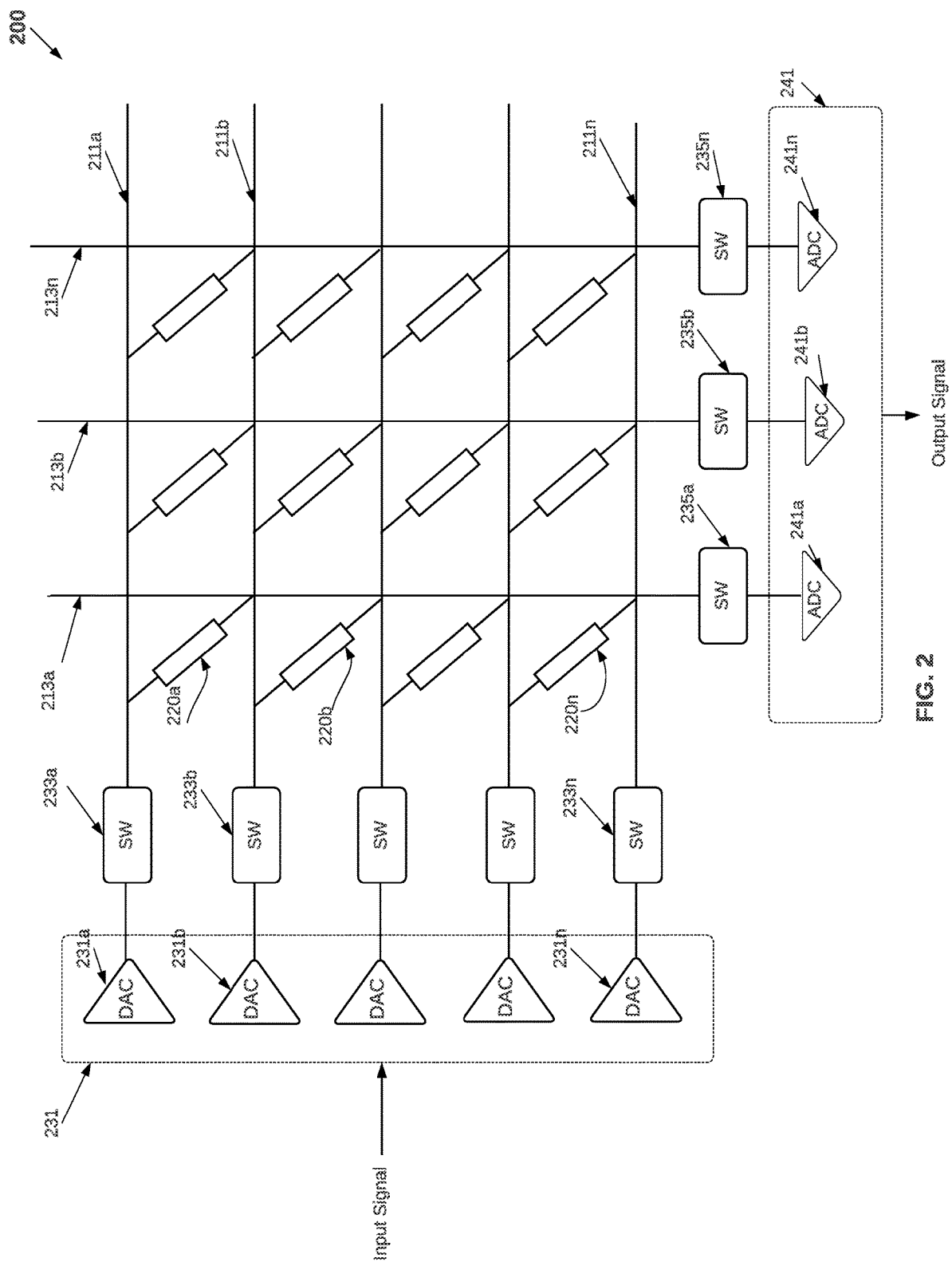
FIG. 2 is a diagram illustrating an example of a crossbar array in accordance with some implementations of the disclosure.

FIG. 2 is a diagram illustrating an example 200 of a crossbar array in accordance some embodiments of the present disclosure. As shown, crossbar array 200 may include one or more row wires 211a-n, column wires 213a-n, cross-point devices 220a-n, digital-to-analog converters (DACs) 231a-n, row switches 233a-n, column switches 235a-n, output sensors 241, and/or any other suitable component for implementing a crossbar-based apparatus.

Row wires 211a-n may include a first row wire 211a, a second row wire 211b, . . . , row wire 211n. Each of row wires 211a-n may be and/or include any suitable electrically conductive material. In some embodiments, each row wire 211a-n may be a metal wire. Row wires may include a first row wire 211a, a second row wire 211b, . . . , row wire 211n. Each of row wires 211a-n may be and/or include a metal wire.

Column wires 213a-n may include a first column wire 213a, a second column wire 213b, . . . , column wire 213n. Each of column wires 213a-n may be and/or include any suitable electrically conductive material. In some embodiments, each column wire 213a-n may be a metal wire.

As illustrated in FIG. 2, row wires 211a-n and column wires 213a-n may intersect with each other. Cross-point devices 220a-n may connect intersections between row wires 211a-n and column wires 213a-n. For example, a first cross-point device 220a may connect the first row wire 211a and the first column wire 213a. As another example, a second cross-point device 220b may connect the first row wire 211a and the second column wire 213b. Each cross-point device 220 may be and/or include any suitable device with tunable resistance, such as a memristor, PCM devices, floating gates, spintronic devices, RRAM, SRAM, etc.

Each DAC 231a-n may convert an input digital signal into an output analog signal. In some embodiments, each DAC 231 may include an op-amp. In some embodiments, DAC 231 may be connected to an op-amp for converting a digital input signal into an analog output signal.

Each of row wires 211a-n may be connected to one or more row switches 233a, 233b, . . . , 233n. Each row switches 233a-n may include any suitable circuit structure that may control current flowing through row wires 211a-n. For example, row switches 233a-n may be and/or include a CMOS switch circuit.

Each of column wires 213a-n may be connected to one or more column switches 235a, 235b, . . . , 235n. Each column switches 235a-n may include any suitable circuit structure that may control current passed through column wires 213a-n. For example, column switches 235a-n may be and/or include a CMOS switch circuit. In some embodiments, one or more of switches 233a-n and 235a-n may further provide fault protection, electrostatic discharge (ESD) protection, noise reduction, and/or any other suitable function for one or more portions of crossbar array 200.

Output sensor(s) 241 may generate an output signal in view of the current flowing through column wires 213a-n. Output sensor(s) 241 may include any suitable component for converting the current into the output signal, such as one or more ADCs 241a, 241b, . . . , 241n. Each ADC 241a-n may convert the current through a respective column wire into a digital output signal. In some embodiments, output sensor(s) 241 may include a multiplexer.

Crossbar array 200 may perform parallel weighted current summation. For example, an input signal may be applied to one or more rows of crossbar array 200 (e.g., one or more selected rows). The input signal may flow through the cross-point devices of the rows of the crossbar array 200. An output signal may be read from the columns (e.g., outputs of the ADCs). According to Ohm's law and Kirchhoff's current law, the input-output relationship of the crossbar can be represented as I=VG, wherein I represents the output signal; V represents the input; and G represents conductance of the cross-point devices. As such, the input signal is weighted at each of the cross-point devices by its conductance according to Ohm's law. The weighted current is outputted via each column wire and may be accumulated according to Kirchhoff's current law.

Figure 3:
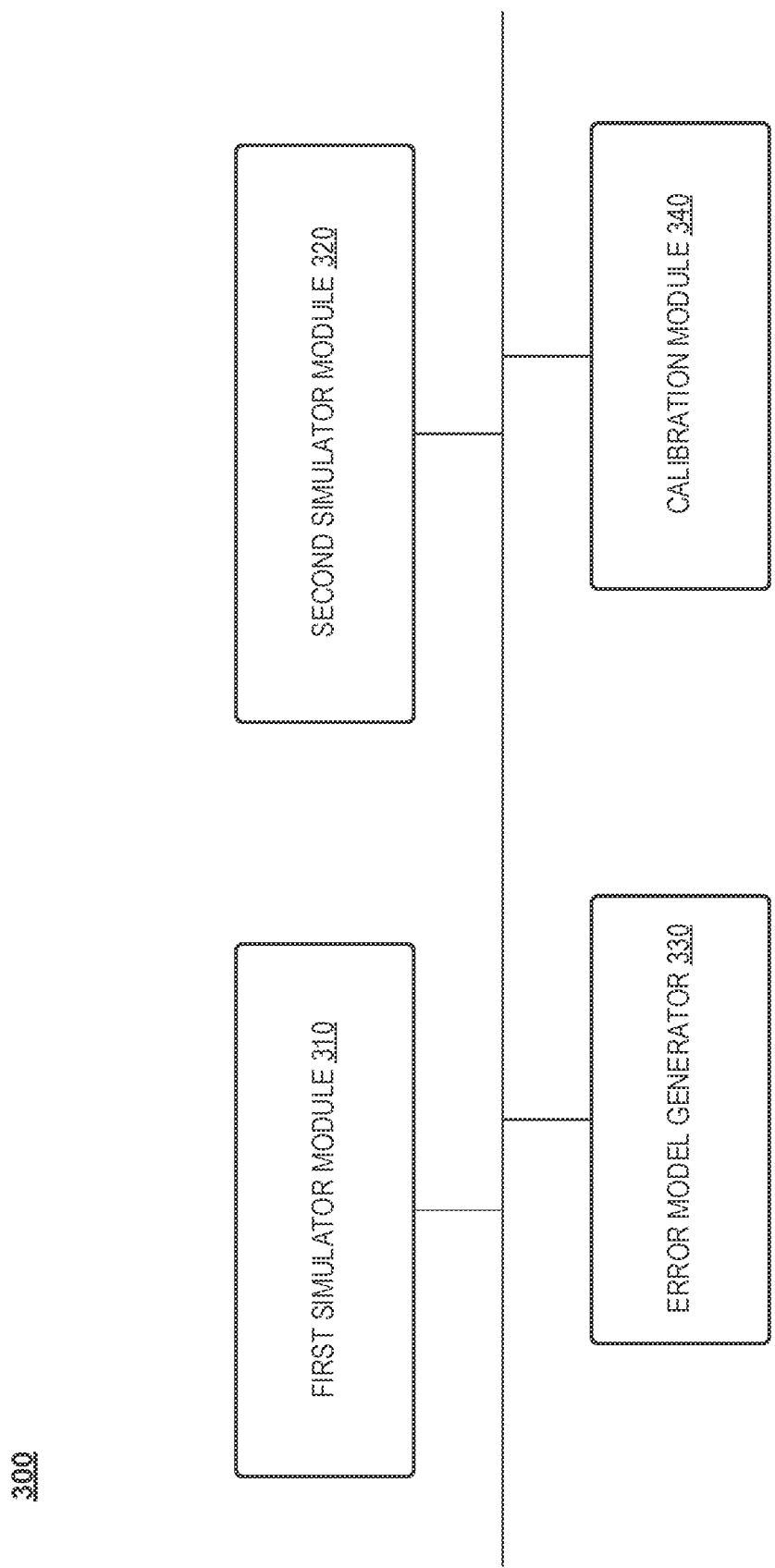
FIG. 3 is a block diagram illustrating an example of a processing device in accordance with some implementations of the disclosure.

FIG. 3 is a block diagram illustrating an example 300 of a processing device in accordance with some embodiments of the present disclosure. As shown, processing device 300 may include a first simulator module 310, a second simulator module 320, an error model generator 330, and a calibration module 340. More or fewer components may be included in processing device 500 without loss of generality. For example, two of the modules may be combined into a single module, or one of the modules may be divided into two or more modules.

First simulator module 310 may generate expected output data representative of the expected results of one or more operations executed by a crossbar-based apparatus. For example, first simulator module 310 may generate the expected output data by processing input data using a first system model that may approximate and/or represent the expected behavior of the crossbar-based apparatus. The first system model is also referred to herein as the "ideal system model." The input data may include a plurality of settings of one or more analog components of the crossbar-based apparatus. Examples of the analog components include one or more DACs, ADCs, TIAs, op-amps, cross-point devices, etc. A respective setting of the crossbar-based apparatus may include one or more configuration parameters associated with one or more components of the crossbar-based apparatus. For example, the configuration parameters may include an input voltage, a reference voltage, etc. of a TIA, DAC, ADC, op-amp, etc. As another example, the configuration parameters may include a gain of a TIA, a gain of an op-amp, etc. In some embodiments, the input data may further include a calibrated conductance pattern of the crossbar-based apparatus. The calibrated conductance pattern may be generated by calibrating the crossbar-based apparatus performing a read operation.

The first system model may include a circuit model comprising a plurality of components corresponding to the analog components of the crossbar-based apparatus (e.g., one or more DACs, ADCs, op-amps, TIAs, cross-point devices). An input signal applied to the first system model may proceed through the components of the circuit model and may be outputted as an output signal of the first system model. The first system model may further include a computational model providing functions and/or methods for determining the output signal based on the input signal. The computational model may include mathematical representations of expected values of configuration parameters of the components of the first system model. The configuration parameters may include, for example, an input voltage, a reference voltage, an output voltage, a gain, a conductance value, etc. The computational model may include functions, etc. for determining the output signal based on the input signal and the expected values of the configuration parameters.

As an example, the first system model may include a circuit model representing the circuit of the crossbar-based apparatus performing a read operation. The first system model may further include a computational model representing a relationship between an expected output of the crossbar-based apparatus performing the read operation and an input of the crossbar-based apparatus (e.g., I=VG). As another example, the first system model may include a circuit model representing the circuit of the crossbar-based apparatus performing a VMM operation Y=XA. The first system model may further include one or more computational models that may be used to map an input vector X to an input signal of the crossbar-based apparatus, matrix A to conductance G, and an output signal of the crossbar-based apparatus to output result Y. In some embodiments, the first system model may be and/or include one or more system models as described in connection with FIGS. 4A and 5A. The expected output data may be outputs of ADC 411 or 511.

Second simulator module 320 may generate simulated output data representative of actual results of one or more operations executed by a crossbar-based apparatus. For example, second simulator module 320 may generate the simulated output data by processing the input data using a second system model that may approximate and/or represent the actual behavior of the crossbar-based apparatus. The second system model is also referred to as the "error model"

herein. The second system model may be and/or include the circuit model of the first system model. The second system model may further include a computational model that may be used to determine the output signal of the second system model based on the input signal of the second system model. For example, the computational model may include mathematical representations of actual values of the configuration parameters of the components of the second system model. The computational model may include functions, etc. for determining the output signal based on the input signal and the actual values of the configuration parameters. For example, a representation of an actual value of a given configuration parameter (e.g., an input voltage of an op-amp) may be and/or include a combination of an expected value of the given configuration parameter and one or more error parameters (e.g., a voltage offset).

Each of the error parameters may approximate one or more errors associated with one or more analog components of the crossbar-based apparatus. The errors may include, for example, a voltage offset, a gain error, etc. For example, the error parameters may include a first error parameter corresponding to a first gain error associated with an op-amp of the crossbar-based apparatus. As another example, the error parameters may include a second error parameter corresponding to a second gain error associated with an ADC. As a further example, the error parameters may include a third error parameter corresponding to a third gain error of a TIA. In some embodiments, the second system model may be and/or include system model 400B of FIG. 4B and/or system model 500B of FIG. 5B. The simulated output data may be outputs of ADC 411 and/or 511 as described in connection with FIGS. 4B and 5B. Error model generator 330 may generate the second system model and/or the error parameters.

Calibration module 340 may generate one or more calibration parameters for calibrating the crossbar-based apparatus. The calibration parameters may compensate for the errors corresponding to the error parameters in the second system model. The calibration parameters may be generated based on the expected output data and/or the simulated output data. Generating the calibration parameters may involve determining the error parameters that may minimize a first difference between the actual output data of the crossbar-based apparatus and the simulated output data. Generating the calibration parameters may further involve determining the calibration parameters that may minimize a second difference between the simulated output data and calibrated simulated output data generated by calibrating the simulated output data.

For example, error model generator 330 may obtain one or more initial error parameters and generate the second system model based on the initial error parameters. In some embodiments, obtaining the initial error parameters may involve testing one or more portions of the crossbar-based apparatus to determine one or more errors associated with the portions of the crossbar-based apparatus. For example, the processing device may obtain an input voltage of an op-amp of the crossbar-based apparatus and an output voltage of the op-amp. The processing device may determine an actual gain based on the obtained input voltage and the output voltage. The processing device may then determine an initial error parameter based on a difference between the actual gain and an expected gain of the op-amp (e.g., by fitting the actual gain to the expected gain). As another example, the processing device may obtain an actual output of a column wire of the crossbar-based apparatus. The processing device may determine one or more initial parameters by fitting the actual output of the column wire to an expected output of the column wire.

Error model generator 330 may generate the second system model based on the initial error parameters. Error model generator 330 may provide the second system model comprising the initial error parameters to second simulator module 320. Second simulator module 320 may generate simulated output data by processing the input data using the second system model. Second simulator module 320 may then provide the simulated output data to calibration module 340 and error model generator 330 for further processing.

Error model generator 330 may compare the simulated output data and actual output data of the crossbar-based apparatus and may determine a difference between the simulated output data and the actual output data based on the comparison. Error model generator 330 may determine error parameters that may minimize the difference between the simulated output data and the actual output data. In some embodiments, error model generator 330 may determine whether the difference between the simulated output data and the actual output data is minimized. In response to determining that the difference is not minimized, error model generator 330 may update the current error parameters and may update the second system model based on the updated error parameters. Error model generator 330 may then provide the updated second system model to second simulator module 320. Second simulator module 320 may generate updated simulated output data by processing the input data using the updated second system model. The updated simulated output data may be provided to error model generator 330 and/or calibration module 340 for further processing.

Calibration module 340 may calibrate the simulated output data using one or more initial calibration parameters. Each of the initial calibration parameters may compensate for one or more errors corresponding to one or more of the initial error parameters. Calibration module 340 may then determine whether the difference between the calibrated simulated output data and the expected output data is minimized (also referred to as the "second difference"). In some embodiments, calibration module 340 may update the calibration parameters in response to determining that the second difference is not minimized. For example, the calibration parameters may be updated utilizing a gradient-based search algorithm. Calibration module 340 may then update the calibrated simulated output data based on the updated calibration parameters. For example, calibration module 340 may obtain the updated simulated output data from second simulator module 320. Calibration module 340 may then calibrate the updated simulated output data using the updated calibration parameters. The calibration parameters may be updated iteratively as described above until the second difference is minimized. In some embodiments, in response to determining that the second difference is minimized, calibration module 340 may output the current calibration parameters for calibrating the crossbar-based apparatus.

Figure 4A:
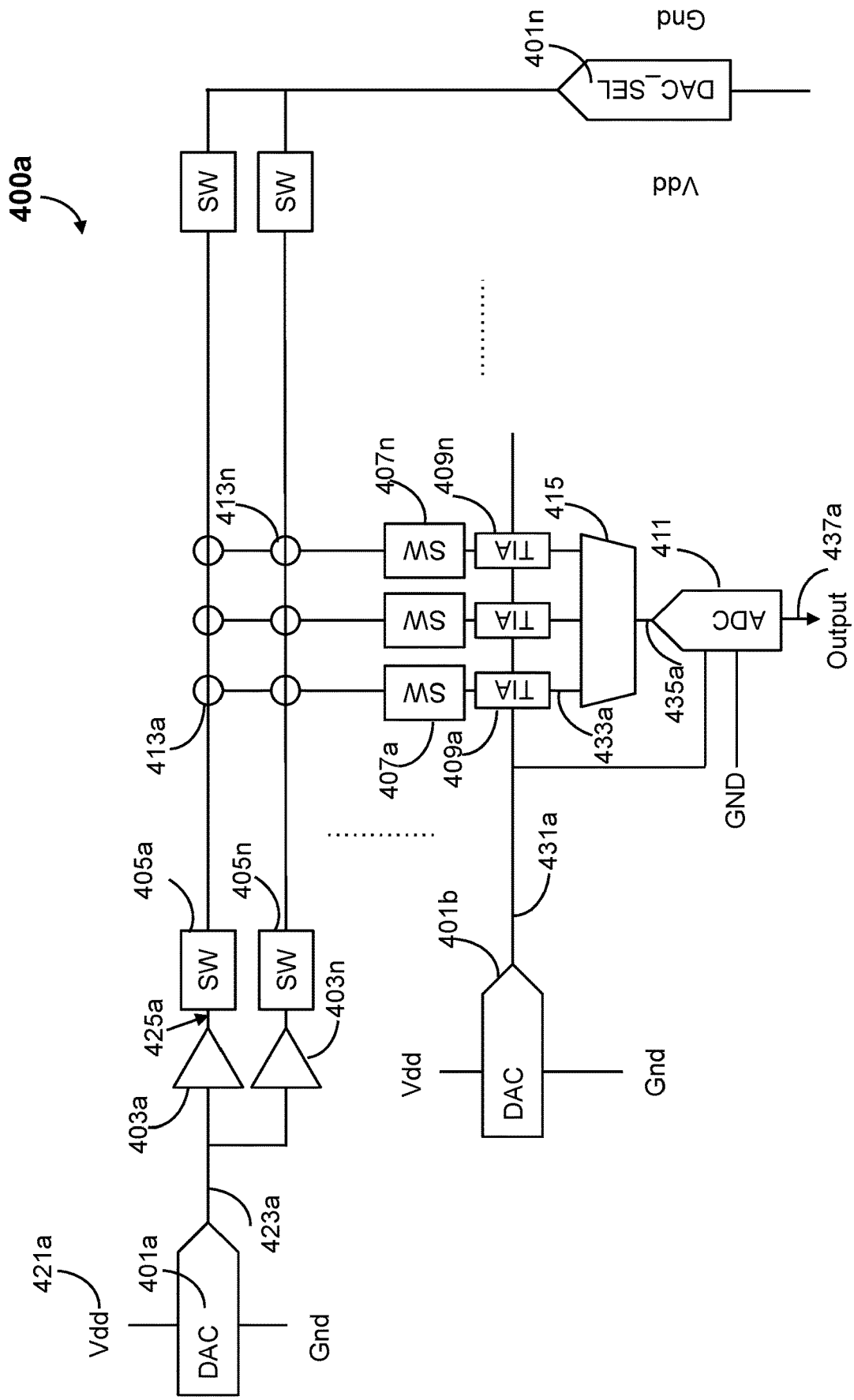
FIG. 4A is a diagram illustrating an example of a system model representative of the expected behavior of a crossbar-based apparatus performing read operations in accordance with some implementations of the disclosure.

FIG. 4A is a block diagram illustrating an example 400a of a system model representative of the expected behavior of a crossbar-based apparatus in accordance with some embodiments of the present disclosure. System model 400a may represent the expected behavior of the crossbar-based apparatus performing read operations.

As shown, system model 400a may include one or more DACs 401a-n, op-amps 403a-n, row switches 405a-n, column switches 407a-n, TIAs 409a-n, ADCs 411, cross-point devices 413a-n, multiplexer 415, etc. The components of system model 400a may correspond to their counterparts in crossbar array 200 of FIG. 2. For example, DAC 401a-n may represent DAC 231a-n of FIG. 2. Cross-point devices 413a-n may correspond to cross-point devices 220a-n of FIG. 2. ADC 411 may represent ADC 241a-n of FIG. 2.

DAC 401a may convert an input digital signal 421a into an output analog signal 423a. The output analog signal 423a may be provided to op-amp 403a as an input. The expected gain of the op-amp may be a ratio of an output voltage 425a of op-amp 403a to the input voltage 423a.

DAC 401b may provide a reference voltage 431a. The reference voltage 431a may be applied to TIAs 409a-n and/or ADCs 413. Each TIA 409a-n may convert an input current into an output voltage. The output voltage may be represented as a function of the input current, the reference voltage, and a gain of the TIA (e.g., a predetermined gain). For example, output voltage 433a of TIA 409a may be determined based on the following formula:

$$V_{TIA} = V_{REFL} - TIA\_GAIN * I_{TIA}, \quad (1)$$

wherein $V_{TIA}$ denotes the output voltage of TIA 409a; TIA_GAIN denotes the expected gain of TIA 409a; $I_{TIA}$ denotes the current through TIA 409a.

The output voltages of TIAs 409a-n may be provided to a multiplexer MUX 415. MUX 415 may selectively output one or more of the output voltages of TIA 409a-n. Multiplexer 415 may produce an output signal 435a.

ADC 411 may generate a digital output 437a based on the reference voltage 431a and the output voltage 435a of MUX 415. As an example, when a single cross-point device 413a is activated, output 437a may be determined using the following formula:

$$D_{out} = \text{floor}\left[\frac{V_{TIA}}{V_{REFL} - V_{LOW}} \cdot 2^M\right] \quad (2)$$

$$= \text{floor}\left[\frac{(V_{REFL} - TIA_{GAIN} \cdot V \cdot G)}{V_{REFL} - V_{LOW}} \cdot 2^M\right],$$

where $D_{out}$ denotes output 437a; and $V_{REFL}$ denotes reference voltage 431a. M denotes the resolution of TIA 409a. In some embodiments, the resolution of a specific TIA is a known value. $V_{Low}$ denotes a reference voltage applied to ADC 411 that is lower than $V_{REFL}$. In some embodiments, $V_{Low}$ equals 0. V denotes the expected input voltage of cross-point device 413a. G denotes the expected conductance of cross-point device 413a.

Figure 4B:
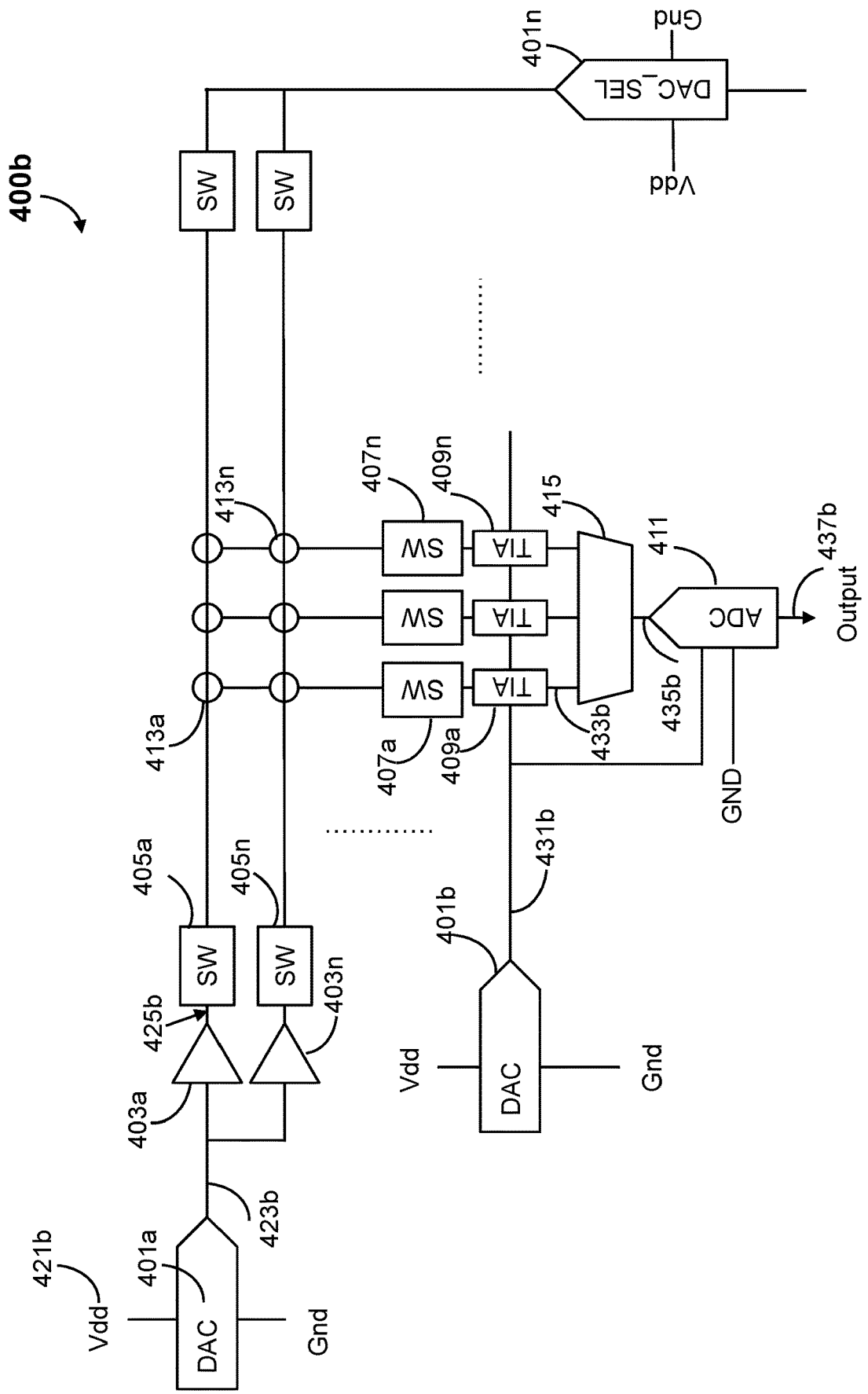
FIG. 4B is a diagram illustrating an example of a system model representative of the actual behavior of a crossbar-based apparatus performing read operations in accordance with some implementations of the disclosure.

FIG. 4B is a block diagram illustrating an example 400b of a system model representative of actual behavior of a crossbar-based apparatus in accordance with some embodiments of the present disclosure. System model 400b may represent the actual behavior of the crossbar array 200 performing read operations. As shown, system model 400b may include the circuit model included in system model 400a.

DAC 401a may convert an input digital signal 421b into an output analog signal 423b. Input digital signal 421b may be represented as a combination of input signal 421a and an error parameter approximating the difference between the expected digital signal provided to the DAC 401a and the actual digital signal provided to DAC 401a. Output analog signal 423b may be represented as a combination of output analog signal 423a and an error parameter approximating the difference between the expected output of DAC 401a and the actual output of DAC 401a (e.g., a voltage offset).

The output analog signal 423b may be provided to op-amp 403a as an input voltage. The actual gain of op-amp 403a may be represented as a ratio of an output voltage 425b of op-amp 403a to input voltage 423b. Output voltage 425b may be represented as a combination of output voltage 425a and an error parameter approximating the difference between the expected output voltage and the actual output voltage of op-amp 403a.

DAC 401b may provide a reference voltage 431b. The reference voltage 431b may be applied to TIAs 409a-n and/or ADCs 411. Each TIA 409a-n may convert an input current to an output voltage 433b. The output voltage 433b may be represented as a function of the input current, the reference voltage, and an actual gain of the TIA. The actual gain of the TIA may be a combination of the actual gain of the TIA and an error parameter approximating the difference between the actual gain and the expected gain of the TIA.

For example, the output voltage 433b may be determined based on the following formula:

$$V'_{TIA} = V'_{REFL} - TIA\_GAIN' * I'_{TIA}, \quad (3)$$

where $V'_{TIA}$ denotes the output voltage 433b; TIA_GAIN' denotes the actual gain of TIA 409a; $V'_{REFL}$ denotes reference voltage 431b; and $I'_{TIA}$ denotes the actual current through TIA 409a.

The outputs of TIAs 409a-n may be provided to MUX 415. MUX 415 may selectively output one or more of the output voltages of TIA 409a-n. MUX 415 may produce an output signal 435b.

ADC 411 may generate a digital output 437a based on the reference voltage 431a and the output voltage 435a of MUX 415. As an example, when a single cross-point device 413a is activated, output 437b may be determined using the following formula:

$$D'_{out} = \text{floor}\left[\frac{V'_{TIA}}{V'_{REFL} - V'_{LOW}} \cdot 2^M\right] \quad (4)$$

$$= \text{floor}\left[\frac{(V'_{REFL} - TIA\_GAIN' \cdot V' \cdot G')}{V'_{REFL} - V'_{LOW}} \cdot 2^M\right], \quad (5)$$

where $D'_{out}$ denotes output 437b; and $V'_{REFL}$ denotes reference voltage 431b. M denotes the resolution of TIA 409a. $V'_{low}$ denotes a reference voltage applied to ADC 411 that is lower than $V'_{REFL}$. V' denotes the actual input voltage of cross-point device 413a. G' denotes the actual conductance of cross-point device 413a.

In some embodiments, $V'_{LOW}$ equals 0. The following equations may be derived from equation (4).

$$D'_{out} = \text{floor}\left[\frac{2^M \cdot G \cdot (1 + X_5) \cdot \left[(1 + X_4) \cdot \left(V_{SRREF} \cdot \frac{V_{dd} + X_1}{2^M} + X_3\right) - V_{REFTIA}\right]}{V_{REFBUF}}\right] \quad (6)$$

-continued $$= \text{floor}\left[\frac{2^M \cdot G \cdot (1+X_5) \cdot \left[(1+X_4) \cdot \left(V_{SRREF} \cdot \frac{V_{dd}+X_1}{2^M} + X_3\right) - V_{REFL} \cdot \frac{V_{dd}+X_1}{2^M} - X_2\right]}{V_{REFL} \cdot \frac{V_{dd}+X_1}{2^M} - X_2}\right] \quad (7)$$

$$V_{REFTIA} = V_{REFL} \cdot \frac{V_{dd}+X_1}{2^M} - X_2 \quad (8)$$

$$V_{REFBUF} = V_{REFL} \cdot \frac{V_{dd}+X_1}{2^M} - X_2 \quad (9)$$

As used herein, $V_{REFTIA}$ represents the actual reference voltage applied to TIA 409a-n. $V_{REFBUF}$ represents the actual reference voltage applied to ADC 411. $V_{dd}$ represents voltage signal 421a. $X_1$ represents an error parameter corresponding to a difference between voltage signals 421a and 421b. $V_{REFL}$ represents reference voltage 431a. $X_2$ represents a difference between reference voltages 431a and 431b. $V_{SRREF}$ represents reference voltage 423a. $X_3$ represents a difference between reference voltages 423a and 423b. $X_4$ represents a difference between voltages 425a and 425b. $X_5$ represents a difference between the expected gain and the actual gain of TIA 409a.

Figure 5A:
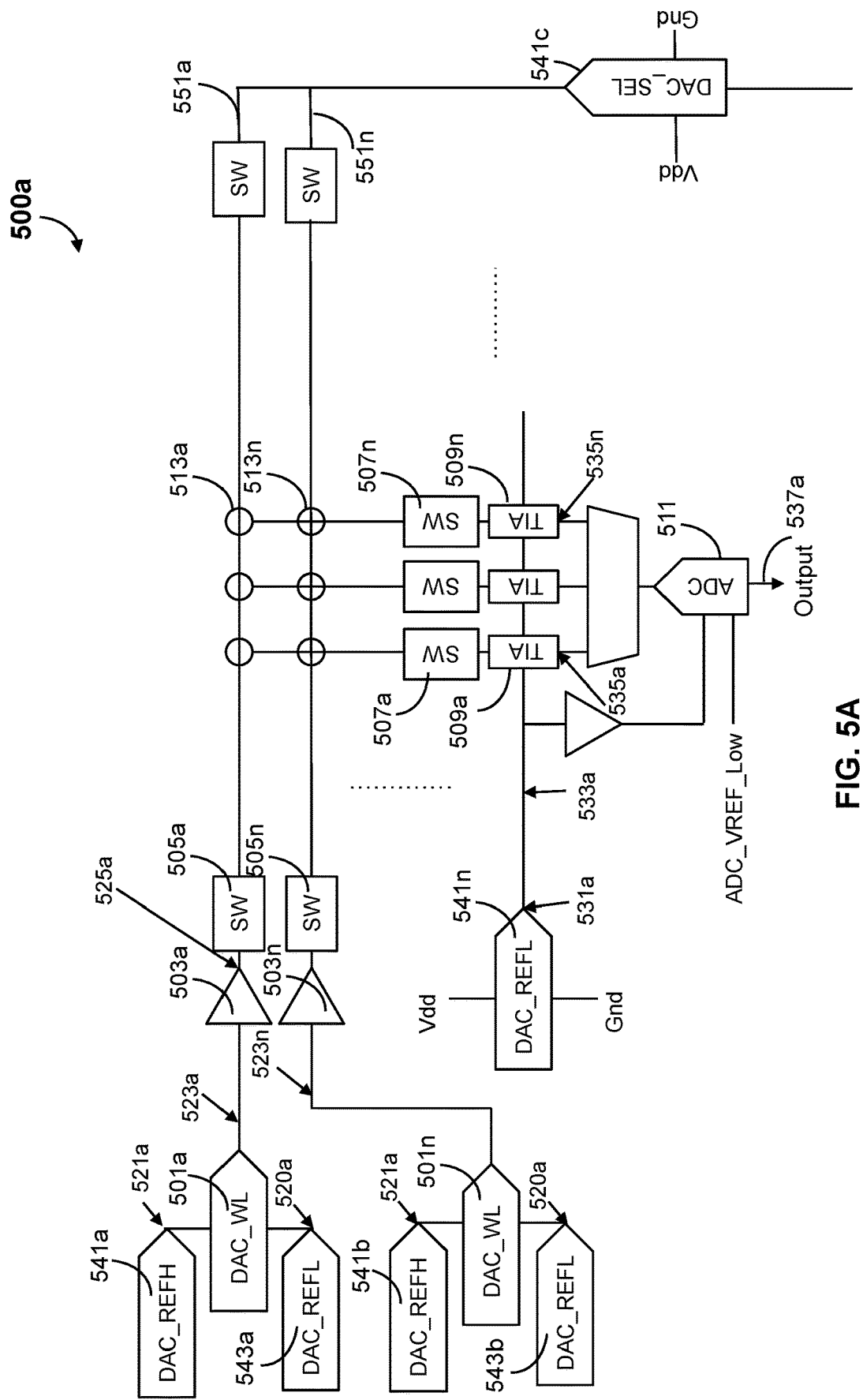
FIG. 5A is a diagram illustrating an example of a system model representative of the expected behavior of a crossbar-based apparatus performing vector-matrix multiplication (VMM) operations in accordance with some implementations of the disclosure.

FIG. 5A is a block diagram illustrating an example 500a of a system model representative of the expected behavior of a crossbar-based apparatus in accordance with some embodiments of the present disclosure. System model 500a may represent the expected behavior of the crossbar-based apparatus performing VNM operations.

As shown, system model 500a may include one or more DACs 501a-n, DACs 541a-n, DACs 543a-b, op-amps 503a-n, row switches 505a-n, column switches 507a-n, TIAs 509a-n, ADCs 511, cross-point devices 513a-n, etc. The components of system model 500a may correspond to their counterparts in crossbar array 200 of FIG. 2. For example, DAC 501a-n may represent DAC 231a-n of FIG. 2 and may be referred to as wordline (WL) DACs herein. Cross-point devices 513a-n may correspond to cross-point devices 220a-n of FIG. 2. ADC 511 may represent ADC 241a-n of FIG. 2.

A respective WL of the crossbar-based apparatus (e.g., WLs 551a, 551n, etc.) may be driven by a respective local DAC 501a-n instead of a global DAC to have different input voltage values. DAC 501a may convert an input digital signal 521a into an output analog signal 523a. The input digital signal 521a may be provided by DAC 541a in some embodiments. DAC 543a may provide a reference voltage for DAC 501a. The output analog signal 523a may be provided to op-amp 503a as an input voltage. The expected gain of op-amp 503a may be a ratio of an output voltage 525a of op-amp 503a to the input voltage 523a. Similarly, DAC 501n may provide an analog signal 523n to op-amp 503n based on reference signals provided by DAC 541b and DAC 543b. Signals 523a and 523n may be different. In some embodiments, DAC 541a and DAC 541b may be the same DAC. In some embodiments, DAC 543a and DAC 543b may be the same DAC.

During a VMM operation, multiple WLs (e.g., rows) of the crossbar-based apparatus may be activated at the same time. For example, WLs 551a and 551n may be activated at the same and may be driven by DAC 501a and DAC 501n, respectively. WLs 551a and 551n may correspond to rows 211a and 211n of FIG. 2, respectively.

DAC 541n may provide a reference voltage 531a. The reference voltage 531a may be provided to TIAs 509a-n and/or ADC 511 as a reference voltage. The reference voltage applied to TIAs 509a-n and/or ADC 511 may be voltage 533a. Each TIA 509a-n may convert an input current to an output voltage (e.g., output voltage 535a, . . . , 535n). The output voltage 535a-n may be represented as a function of the input current, the reference voltage, and a gain of the corresponding TIA (e.g., a predetermined gain).

ADC 511 may generate a digital output 537a based on the reference voltage 533a and the output voltage 535a-n of the respective TIA.

Figure 5B:
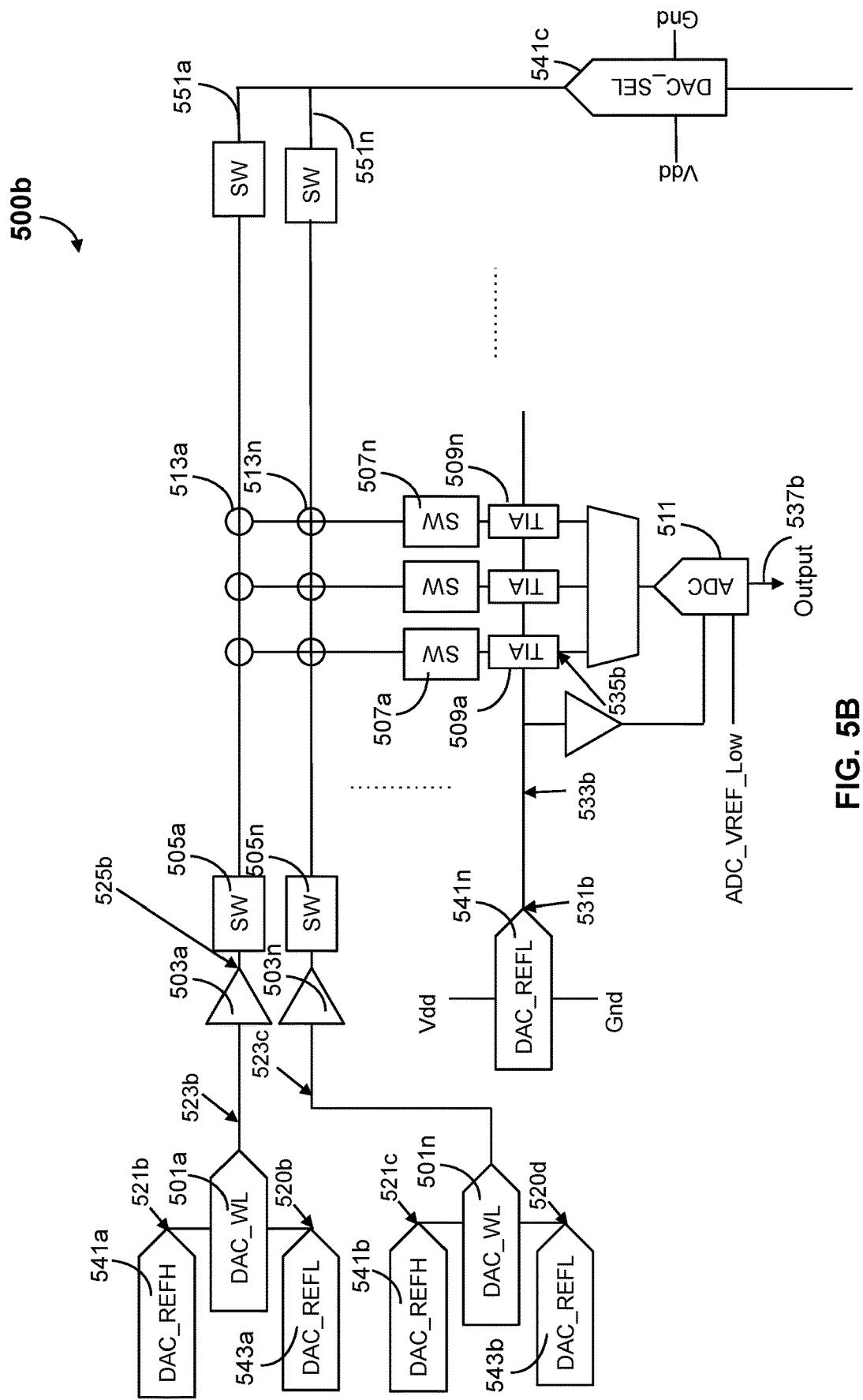
FIG. 5B is a diagram illustrating an example of a system model representative of the actual behavior of a crossbar-based apparatus performing VMM operations in accordance with some implementations of the disclosure.

FIG. 5B is a block diagram illustrating an example 500b of a system model representative of actual behavior of a crossbar-based apparatus in accordance with some embodiments of the present disclosure. System model 500b may be a circuit model representative of the actual behavior of a crossbar-based apparatus including crossbar array 200 configured to perform VMM operations.

DAC 501a may convert an input digital signal 521b into an output analog signal 523b. Input digital signal 521b may be represented as a combination of input signal 521a and an error parameter approximating the difference between the expected digital signal provided to DAC 501a and the actual digital signal provided to DAC 501a (e.g., the actual output of DAC 501b). Output analog signal 523b may be represented as a combination of output analog signal 523a and an error parameter approximating the difference between the expected output of DAC 501a and the actual output of DAC 501a (e.g., a voltage offset).

The output analog signal 523b may be provided to op-amp 503a as an input voltage. The actual gain of op-amp 503a may be represented as a ratio of an output voltage 525b of op-amp 503a to input voltage 523b. Output voltage 525b may be represented as a combination of output voltage 525a and an error parameter approximating the difference between the expected output voltage and the actual output voltage of op-amp 503a.

Similarly, DAC 501n may convert an input digital signal into an output analog signal 523c. Output analog signal 523c may be provided to op-amp 503n as an input voltage.

DAC 501n may provide an output voltage signal 531b. The output voltage signal 531b may be provided to TIAs 509a-n and/or ADC 511 as a reference voltage. The actual reference voltage applied to TIAs 509a-n and/or ADC 511 may be reference voltage 533b. The reference voltage 533b may be represented as a combination of the output signal 531b and an error parameter representing a voltage offset and/or any other difference between the output signal 531b and the reference voltage 533b. Each TIA 509a-n may convert an input current to an output voltage 535b. The output voltage 535b may be represented as a function of the input current, the reference voltage 533b, and an actual gain of the TIA. The actual gain of the TIA may be a combination of the actual gain of the TIA and an error parameter approximating the difference between the actual gain and the expected gain of the TIA.

As described above, each WL of the crossbar-based apparatus may be driven by a respective local DAC 501a-n instead of global DAC to have different input voltage values. Multiple WLs may be driven at the same time. During a VMM operation, multiple TIAs 509a-n are sinking current at the same time. As a result, there may be variations in inputs and outputs of DACs 501a-n while the DACs are connecting to the same reference voltage sources. Similarly, there may be variations in the inputs and/or outputs of the TIAs while the TIAs are connecting to the same reference voltage sources. System model 500b may include one or more computational models approximating the impact of such variations in DACs 501a-n and TIAs 509a-n. The variations may be reflected by the degradation in reference voltages. For example, as multiple working WL DACs connecting to $V_{REFH}$ (reference voltage 521a of FIG. 5A) and $V_{REFL}$ (reference voltage 523a of FIG. 5A), and multiple working TIAs connecting to $V_{REFTIA}$ (reference voltage 533a of FIG. 5A), circuit components physically far from the reference sources may see degraded reference signals. The actual reference voltage applied to a DAC may be represented as the reference voltage provided to the DAC and a degraded reference signal. The actual reference voltage applied to each TIA may be represented as a combination of a reference voltage to the TIA and a degraded reference signal. For example, the actual reference voltages applied to the DACs and TIAs may be determined based on the following equations:

$$V_{REFHWLDAC}=V_{REFH}+V_{REFHdegration} \cdot [N_{WL}-1, N_{WL}-2, \ldots, 0]; \quad (10)$$

$$V_{REFLWLDAC}=V_{REFL}+V_{REFLdegration} \cdot [N_{WL}-1, N_{WL}-2, \ldots, 0]; \quad (11)$$

$$V_{REFTIA} = \quad (12)$$
$$V_{REFL} \cdot \frac{V_{dd}+X_1}{2^M} - X_2 + V_{TIAdegration} \cdot [N_{TIA}-1, N_{TIA}-2, \ldots, 0].$$

$V_{REFHWLDAC}$ and $V_{REFLWLDAC}$ are two $N_{WL} \times 1$ vectors representing the reference voltages actually applied to $N_{WL}$ working WL DACs. $V_{REFTIA}$ is a $N_{BL} \times 1$ vector representing the reference voltage actually applied to $N_{TIA}$ working TIAs. $N_{WL}$ represents the number of the working WL DACs. $N_{TIA}$ represents the number of the working TIAs. Each of $V_{REFHdegration}$, $V_{REFLdegration}$, and $V_{TIAdegration}$ may represent a degraded reference signal.

Accordingly, the input voltage at $N_{WL}$ selected WLs are:

$$V_{WLinput} = \quad (13)$$
$$(1+X4) \cdot \left( WL_{DIN} \odot \frac{V_{REFHWLDAC}-V_{REFLWLDAC}}{2^M} + V_{REFLWLDAC} \right),$$

where $\odot$ is the element-wise multiplication operation. The input current of each TIA at the ith column may be modelled as:

$$I'_{TIA,i}=(V_{WLinput}-V_{REFTIA}(i) * G(1:N_{WL},i)). \quad (14)$$

$G(1:N_{WL}, i)$ represents a conductance pattern of the cross-point devices at the ith column. In some embodiments, the conductance pattern may be determined by performing one or more operations as described in connection with FIG. 10. The TIA output voltage 535b may then be determined based on equation 3. The output signal 537b D'$_{out}$ can be determined based on equation 4.

Figure 6:
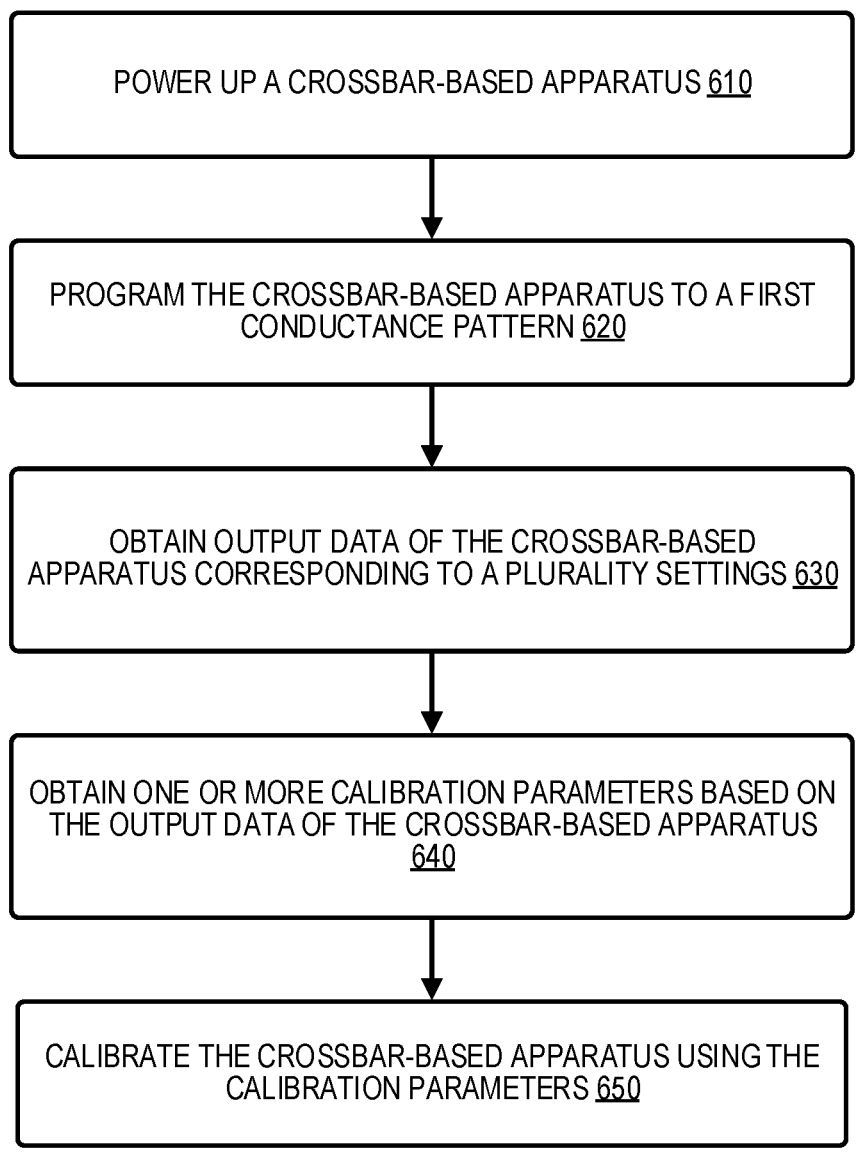
FIG. 6 is a flow diagram illustrating a method for calibrating a crossbar-based apparatus, according to some implementations of the disclosure.

FIG. 6 is a flow diagram illustrating a method 600 for calibrating a crossbar-based apparatus according to some implementations of the disclosure. Method 600 may be performed by processing logic that comprises hardware (e.g., circuitry, dedicated logic, programmable logic, microcode, etc.), software (e.g., instructions run on a processing device to perform hardware simulation), or a combination thereof.

Method 600 may begin at block 610 when a crossbar-based apparatus may be powered up. The crossbar computing system may include one or more crossbar arrays. Each of the crossbar arrays may be and/or include a circuit structure including a plurality of wires, such as one or more row wires, one or more column wires, etc. The circuit structure may further include one or more cross-point devices connecting the plurality of wires. In some embodiments, the crossbar-based apparatus may include one or more crossbar arrays as described in connection with FIG. 2. The crossbar-based apparatus may be configured to perform one or more operations, such as one or more read operations, VMM operations, neural processing operations, etc.

At block 620, the crossbar-based apparatus may be programmed to a first conductance pattern. For example, one or more cross-point devices of the crossbar-based apparatus may be programmed to suitable conductance. Programming a cross-point device may involve applying a suitable voltage signal or current signal across the cross-point device. In some embodiments, the first conductance pattern may be a predetermined pattern (e.g., a calibrated conductance pattern). For example, the conductance of one or more of the cross-point devices may be set to predetermined values. In some embodiments, the first conductance pattern may be a random pattern. For example, the conductance of one or more of the cross-point devices may be set to random values.

In some embodiments, programming the crossbar-based apparatus may include setting and/or resetting one or more of the cross-point devices. The resistance of each cross-point devices may be electrically switched between a high-resistance state and a low-resistance state. Setting a cross-point device may involve switching the resistance of the cross-point from the high-resistance state to the low-resistance state. Resetting the cross-point device may involve switching the resistance of the cross-point from the low-resistance state to the high-resistance state.

At step 630, output data corresponding to a plurality of settings of the crossbar-based apparatus may be obtained. A respective setting of the crossbar-based apparatus may include one or more configuration parameters associated with one or more components of the crossbar-based apparatus, such as an input voltage, a reference voltage, a gain, etc. As an example, each of the settings of the crossbar-based apparatus may include a value of reference voltage 431a, a value of reference voltage 423a, a value of the gain of TIA 409a-n, a value of voltage signal 421a as described in connection with FIGS. 4A-4B.

The output data may represent computing results (e.g., actual results) of one or more operations executed by one or portions of the crossbar-based apparatus with the plurality of settings. Examples of the operations may include a read operation, a VMM operation, a neural processing operation, etc. The output data may include a plurality of outputs of crossbar array 200 of FIG. 2.

At block 640, one or more calibration parameters may be obtained based on the output data of the crossbar-based apparatus. The calibration parameters may be used to compensate for one or more errors associated with one or more analog components of the crossbar-based apparatus. The analog components may include, for example, one or more cross-point devices, op-amps, DACs, ADCs, TIAs, etc. The errors may include, for example, a gain error, a voltage offset, a conductance offset (e.g., a deviation of an actual conductance of a cross-point device from an expected conductance of the cross-point device), etc. The calibration parameters may include, for example, one or more calibration parameters corresponding to gain errors associated with one or more op-amps, DACs, ADCs, TIAs, etc. of the crossbar-based apparatus. As an example, a calibration parameter corresponding to a gain error associated with an op-amp may include an offset to be applied to a reference voltage of the op-amp.

In some embodiments, obtaining the calibration parameters may involve performing one or more operations described in connection with FIG. 7 below. In some embodiments, the calibration parameters may be obtained from a processing device that is capable of processing the output data and generating the calibration parameters based on the output data. For example, the crossbar-based apparatus may provide the output data to the processing device. The processing device may generate the calibration parameters based on the output data (e.g., by performing one or more operations described in connection with FIGS. 7-9). The processing device may then provide the calibration parameters to the crossbar-based apparatus.

At block 650, the crossbar-based apparatus may be calibrated using the calibration parameters. For example, the calibration parameters may be stored on one or more circuit registers of the crossbar-based apparatus. The analog components of the crossbar-based apparatus may be configured based on the calibration parameters to compensate for the errors corresponding to the calibration parameters.

Figure 7:
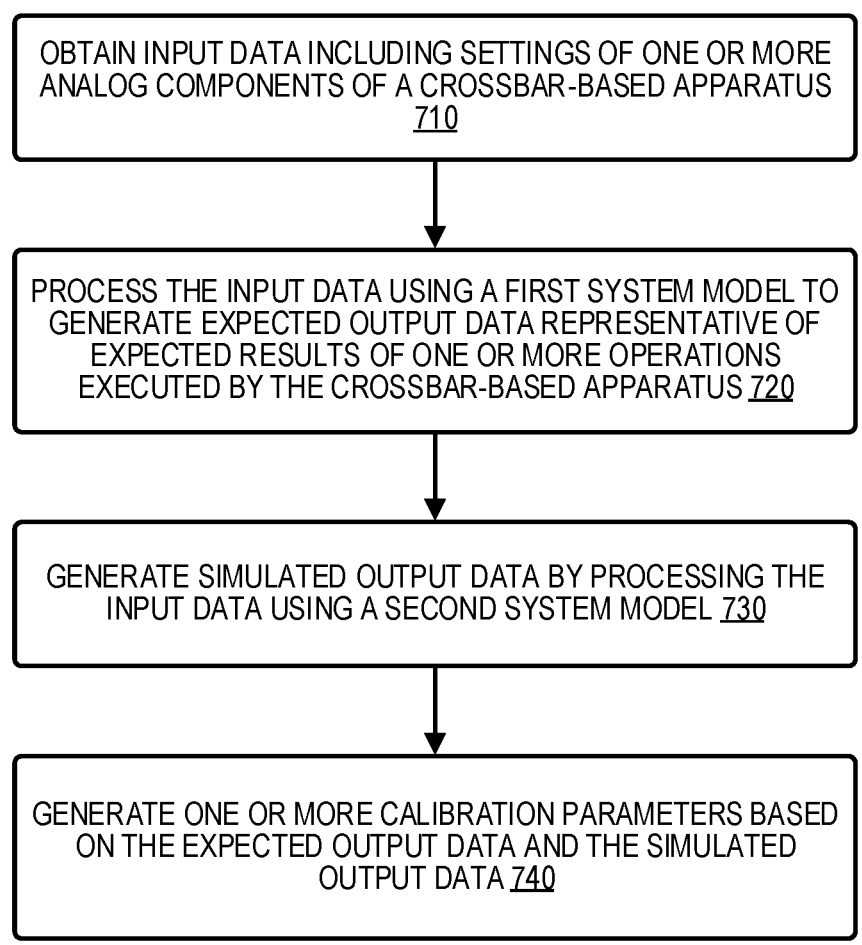
FIG. 7 is a flow diagram illustrating a method for obtaining calibration parameters for calibrating a crossbar-based apparatus, according to some implementations of the disclosure.

FIG. 7 is a flow diagram illustrating a method 700 for obtaining calibration parameters for calibrating a crossbar-based apparatus according to some implementations of the disclosure. Method 700 may be performed by processing logic that comprises hardware (e.g., circuitry, dedicated logic, programmable logic, microcode, etc.), software (e.g., instructions run on a processing device to perform hardware simulation), or a combination thereof.

Method 700 may begin at block 710 where a processing device may obtain input data including settings of one or more analog components of a crossbar-based apparatus. In some embodiments, each of the settings may include a set of values of voltage 421a, reference voltage 431a, reference voltage 423a, and a TIA gain as described in connection with FIGS. 4A-4B. In some embodiments, the input data may further include a calibrated conductance pattern of the crossbar-based apparatus. The calibrated conductance pattern may be generated by calibrating the crossbar-based apparatus performing a read operation as described herein.

At block 720, the processing device may process the input data using a first system model to generate expected output data representative of the expected results of one or more operations executed by the crossbar-based apparatus. The first system model may approximate and/or represent the expected behavior of the crossbar-based apparatus (e.g., the physical circuit of the computing system). For example, the first system model may include a circuit model comprising a plurality of components corresponding to the components of the crossbar-based apparatus (e.g., one or more DACs, ADCs, op-amps, TIAs, cross-point devices). The first system model may further include a computational model that may be used to determine the output signal based on the input signal. For example, the computational model may include mathematical representations of expected values of configuration parameters of the components of the first system model. The configuration parameters may include, for example, an input voltage, a reference voltage, an output voltage, a gain, a conductance value, etc. The computational model may include functions, etc. for determining the output signal based on the input signal and the expected values of the configuration parameters. In some embodiments, the expected output data may be generated based on system model 400a of FIG. 4A and/or equations (1)-(2). In some embodiments, the expected output data may be generated based on system model 500a of FIG. 5A.

At block 730, the processing device may generate simulated output data by processing the input data using a second system model. The simulated output data may represent computing results of the one or more operations executed by the crossbar-based apparatus with the settings. The second system model may be and/or include a circuit model, a computational model, and/or any other suitable model representing the actual behavior of the crossbar-based apparatus. For example, the second system model may include a circuit model comprising a plurality of components corresponding to the components of the crossbar-based apparatus (e.g., one or more DACs, ADCs, op-amps, TIAs, cross-point devices). An input signal applied to the second system model may proceed through the components of the circuit model and may be outputted as an output signal by the second system model. In some embodiments, the circuit model of the second system model may be the same as the circuit model of the first system model.

The second system model may further include a computational model providing how the output signal of the second system model may be determined based on the input signal of the second system model. For example, the computational model may include mathematical representations of expected values of the configuration parameters of the components of the first system model. The computational model may include functions, etc. for determining the output signal based on the input signal and the actual values of the configuration parameters. In some embodiments, a representation of an actual value of a given configuration parameter (e.g., an input voltage of an op-amp) may be and/or include a combination of an expected value of the given configuration parameter and one or more error parameters. Each of the error parameters may approximate one or more errors associated with one or more analog components of the crossbar-based apparatus, such as a gain error, a voltage offset, etc. For example, the error parameters may include a first error parameter corresponding to a first gain error associated with an op-amp of the crossbar-based apparatus. As another example, the error parameters may include a second error parameter corresponding to a second gain error associated with an ADC. As a further example, the error parameters may include a third error parameter corresponding to a third gain error of a TIA. In some embodiments, the second system model may be and/or include one or more system models as described in connection with FIGS. 4B and 5B above. In some embodiments, the error parameters may include $X_1$, $X_2$, $X_3$, $X_4$, and/or $X_5$ in equations (6)-(7). In some embodiments, the simulated output data may be generated based on system model 400b of FIG. 4B and/or equations (3)-(9). In some embodiments, the error parameters may include a degraded reference signal as described in connection with FIG. 5B. The simulated output data may be generated based on system model 500b of FIG. 5B and/or equations (3)-(4) and (10)-(14).

At block 740, the processing device may generate one or more calibration parameters based on the expected output data, the simulated output data, and output data of the crossbar-based apparatus. For example, the processing device may calibrate the simulated output data to generate calibrated simulated output data. The processing device may further determine the calibration parameters that may minimize a difference between the simulated output data and the calibrated simulated output data. The processing device may further determine the error parameters of the second system that may minimize a difference between the output of the crossbar-based apparatus and the simulated output data. In some embodiments, determining the error parameters may involve determining the values of $X_1$, $X_2$, $X_3$, $X_4$, and/or $X_5$ in equations (6)-(7). In some embodiments, generating the calibration parameters may involve performing one or more operations as described in connection with FIGS. 8-9 below.

Figure 8:
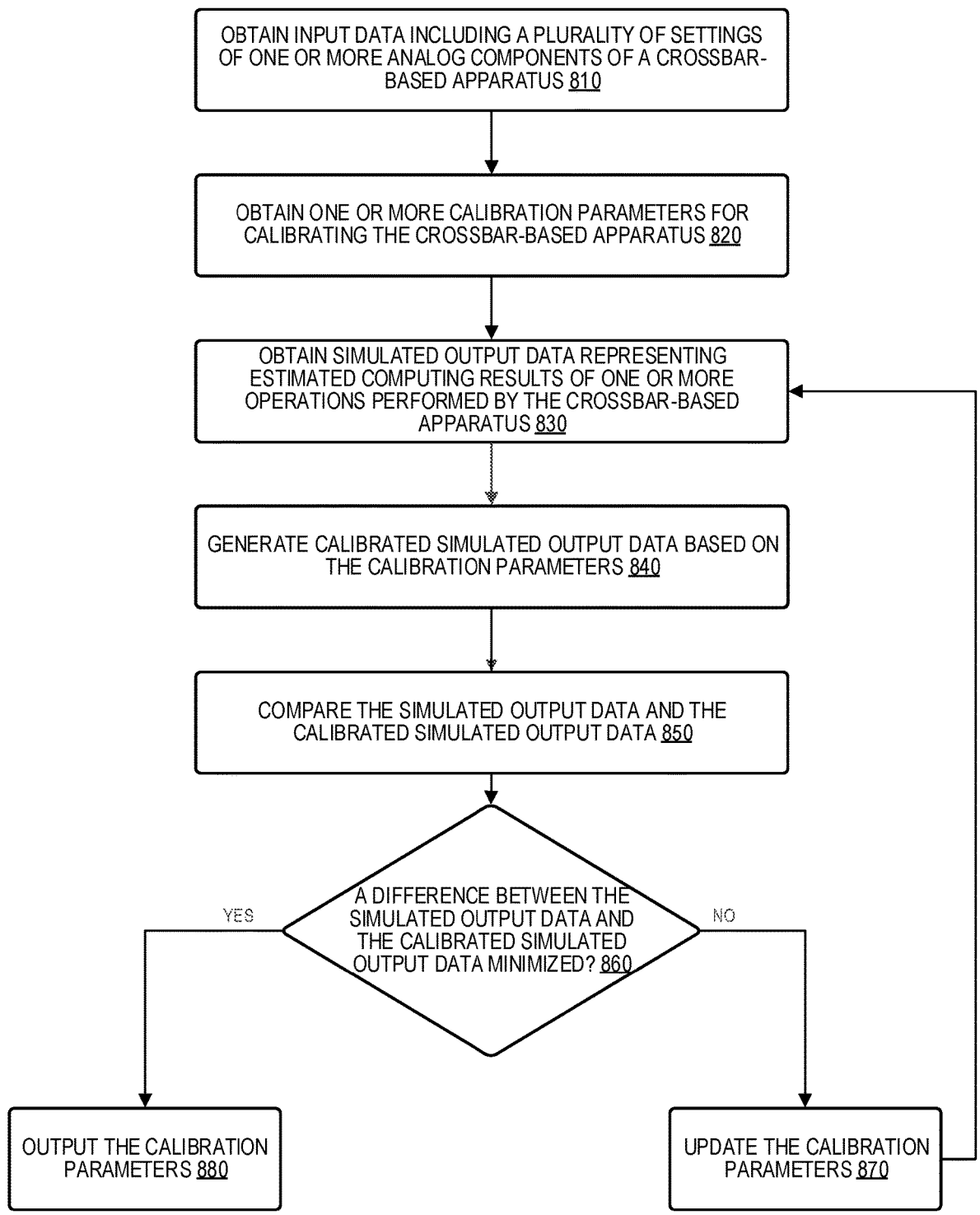
FIG. 8 is a flow diagram illustrating a method for generating calibration parameters for calibrating a crossbar-based apparatus according to some implementations of the disclosure.

FIG. 8 is a flow diagram illustrating a method 800 for generating calibration parameters for calibrating a crossbar-based apparatus according to some implementations of the disclosure. Method 800 may be performed by processing logic that comprises hardware (e.g., circuitry, dedicated logic, programmable logic, microcode, etc.), software (e.g., instructions run on a processing device to perform hardware simulation), or a combination thereof. In some embodiments, method 800 may be implemented by a processing device executing the calibration module 340 of FIG. 3.

Method 800 may begin at block 810 where a processing device may obtain input data including settings of one or more components of a crossbar-based apparatus. In some embodiments, the input data may further include a calibrated conductance pattern of the crossbar-based apparatus.

At block 820, the processing device may obtain one or more calibration parameters for calibrating the crossbar-based apparatus. For example, one or more initial calibration parameters may be obtained by testing one or more portions of the crossbar-based apparatus. For example, the processing device may obtain an input voltage of an op-amp of the crossbar-based apparatus and an output voltage of the op-amp. The processing device may determine an actual gain based on the obtained input voltage and the output voltage. The processing device may then determine an initial calibration parameter based on a difference between the actual gain and an expected gain of the op-amp (e.g., by fitting the actual gain to the expected gain). As another example, the processing device may obtain an actual output of a column wire of the crossbar-based apparatus. The processing device may determine one or more initial calibration parameters by fitting the actual output of the column wire to an expected output of the column wire. In some embodiments, the initial calibration parameters may correspond to one or more initial values of the error parameters of the error model (e.g., values of $X_1$, $X_2$, $X_3$, $X_4$, and/or $X_5$ in equations (6)-(7), values of degraded reference signal $V_{REFHdegration}$, $V_{REFLdegration}$, $V_{TIAdegration}$, etc. of equations (11)-(12)).

At block 830, the processing device may obtain simulated output data representing estimated computing results of one or more operations performed by the crossbar-based apparatus. For example, the processing device may process the input data using the second system model to generate the simulated output data.

At block 840, the processing device may generate calibrated simulated output data based on the simulated output data and the calibration parameters. For example, the processing device may calibrate the simulated output data using the initial calibration parameters.

At block 850, the processing device may compare the simulated output data and calibrated simulated output data and/or determine a difference between the simulated output data and the calibrated simulated output data.

At block 860, the processing device may determine whether the difference is minimized. In some embodiments, in response to determining that the difference between the simulated output data and the calibrated simulated output data is not minimized, the processing device may proceed to block 870 and may update the calibration parameters. For example, the processing device may generate updated calibration parameters. The processing device may then loop back to block 830 and may obtain updated simulated output data. The updated simulated output data may be obtained by processing the input data using the second system model with updated error parameters. The second system model and the error parameters may be generated by performing one or more operations as described in connection with FIG. 9 below.

In some embodiments, in response to determining that the difference between the simulated output and the calibrated output is minimized, the processing device may output the calibrated parameters at block 880. For example, the processing device may provide the updated calibration parameters to the computing device. As another example, the processing device may store the updated calibration parameters in a suitable storage device.

Figure 9:
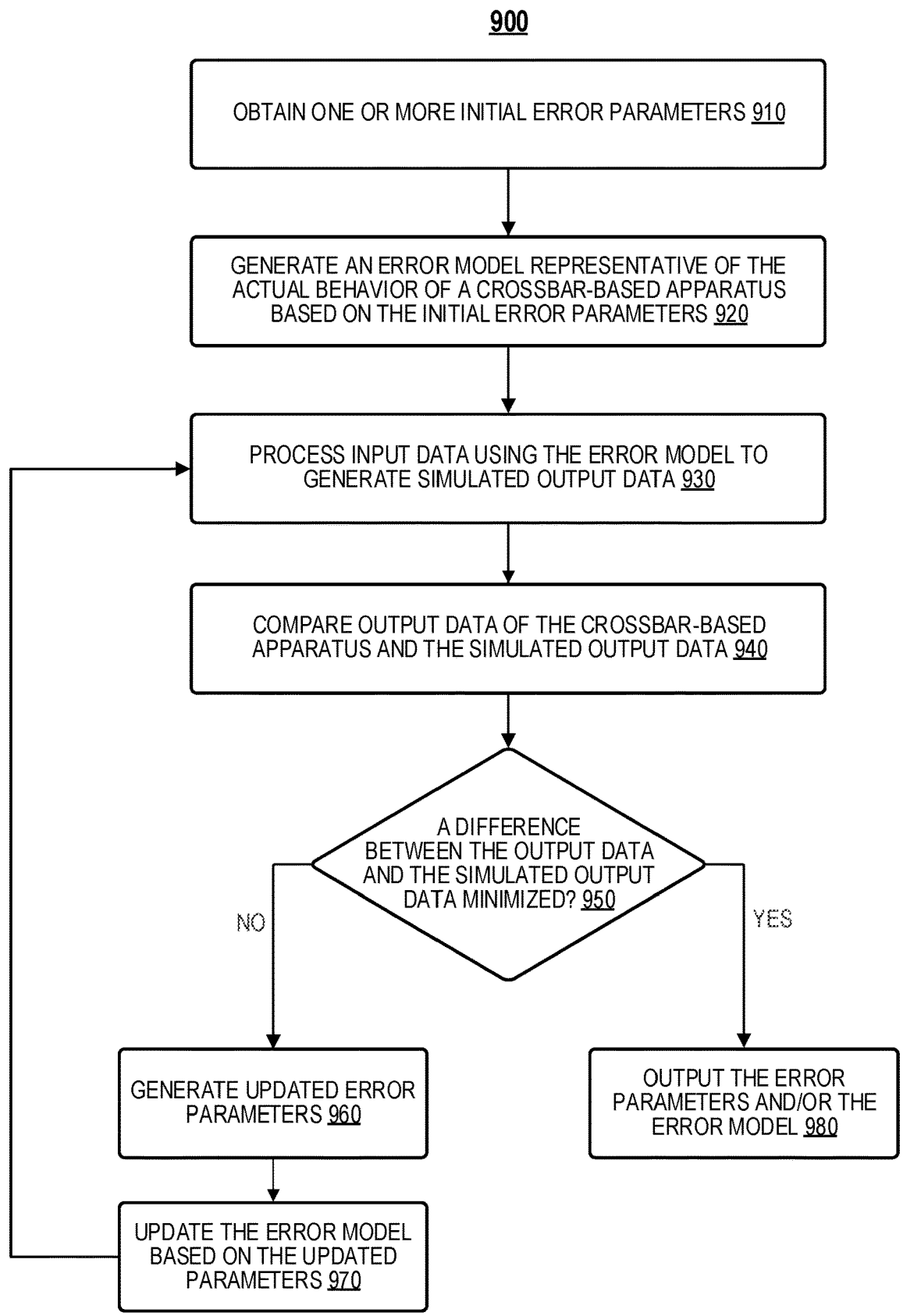
FIG. 9 is a flow diagram illustrating a method of generating error parameters for calibrating a crossbar-based apparatus according to some implementations of the disclosure.

FIG. 9 is a flow diagram illustrating a method 900 of generating error parameters for calibrating a crossbar-based apparatus according to some implementations of the disclosure. Method 900 may be performed by processing logic that comprises hardware (e.g., circuitry, dedicated logic, programmable logic, microcode, etc.), software (e.g., instructions run on a processing device to perform hardware simulation), or a combination thereof. In some embodiments, method 900 may be implemented by a processing device executing the error model generator 330 of FIG. 3.

At 910, the processing device may obtain one or more initial error parameters. Each of the error parameters may approximate a deviation of an actual value of a parameter associated with one or more analog components of the crossbar-based apparatus from an expected value of the parameter associated with the one or more analog components. Examples of the analog components may include an ADC, DAC, TIA, op-amp, etc. Examples of the parameter may include a reference voltage, an input voltage, an output voltage, a gain, etc. In some embodiments, the initial error parameters may include initial values of $X_1$, $X_2$, $X_3$, $X_4$, and/or $X_5$ in equations (6)-(7). In some embodiments, the initial error parameters may include initial values of degraded reference signal $V_{REFHdegration}$, $V_{REFLdegration}$, $V_{TIAdegration}$, etc. of equations (11)-(12).

In some embodiments, obtaining the initial error parameters may involve testing one or more portions of the crossbar-based apparatus. For example, the processing device may obtain an input voltage of an op-amp of the crossbar-based apparatus and an output voltage of the op-amp. The processing device may determine an actual gain based on the obtained input voltage and the output voltage. The processing device may then determine an initial error parameter based on a difference between the actual gain and an expected gain of the op-amp (e.g., by fitting the actual gain to the expected gain). As another example, the processing device may obtain an actual output of a column wire of the crossbar-based apparatus. The processing device may determine one or more initial parameters by fitting the actual output of the column wire to an expected output of the column wire.

At 920, the processing device may generate an error model representative of the actual behavior of the crossbar-based apparatus based on the initial error parameters. The error model may be the second system model as described herein. The error model may include a circuit model representative of the physical circuit of the crossbar-based apparatus. The error model may further include a computational model that may be used to determine an output of the crossbar-based apparatus performing one or more operations based on an input of the crossbar-based apparatus. The computational model may include the initial error parameters.

At block 930, the processing device may process input data using the error model to generate simulated output data. The input data may include a plurality of settings of one or more analog components of the crossbar-based apparatus. The simulated output data may approximate the actual results of the one or more operations executed by the crossbar-based apparatus with the settings.

At 940, the processing device may compare output data of the crossbar-based apparatus and the simulated output data to determine a difference between the output data and the simulated output data. The output data of the crossbar-based apparatus may include computing results of one or more operations performed by the computing device.

At 950, the processing device may determine whether the difference between the output data and the simulated output data is minimized. In some embodiments, in response to determining that the difference between the output data and the simulated output data is not minimized (e.g., "NO" at block 950), the processing device may proceed to block 960 and may generate updated error parameters. For example, the updated error parameters may be generated utilizing an optimization algorithm for searching for the error parameters that may minimize a function representing the difference between the output data and the simulated output data.

At 970, the processing device may update the error model based on the updated error parameters. For example, the processing device may update the error model to include the updated error parameters (e.g., by incorporating the updated error parameters into the computational model).

The processing device may then loop back to 930. For example, the processing device may process the input data using the updated error model to generate updated simulated output data. The processing device may then compare the current simulated output (e.g., the updated simulated output) and the actual output of the computing system.

In some embodiments, the processing device may determine that the difference between the output data of the crossbar-based apparatus and the simulated output data is minimized (e.g., "YES" at block 950). In view of the determination, the processing device may output the error parameters and/or the error model. In some embodiments, the processing device may store the error parameters and/or error model in a suitable storage device.

Figure 10:
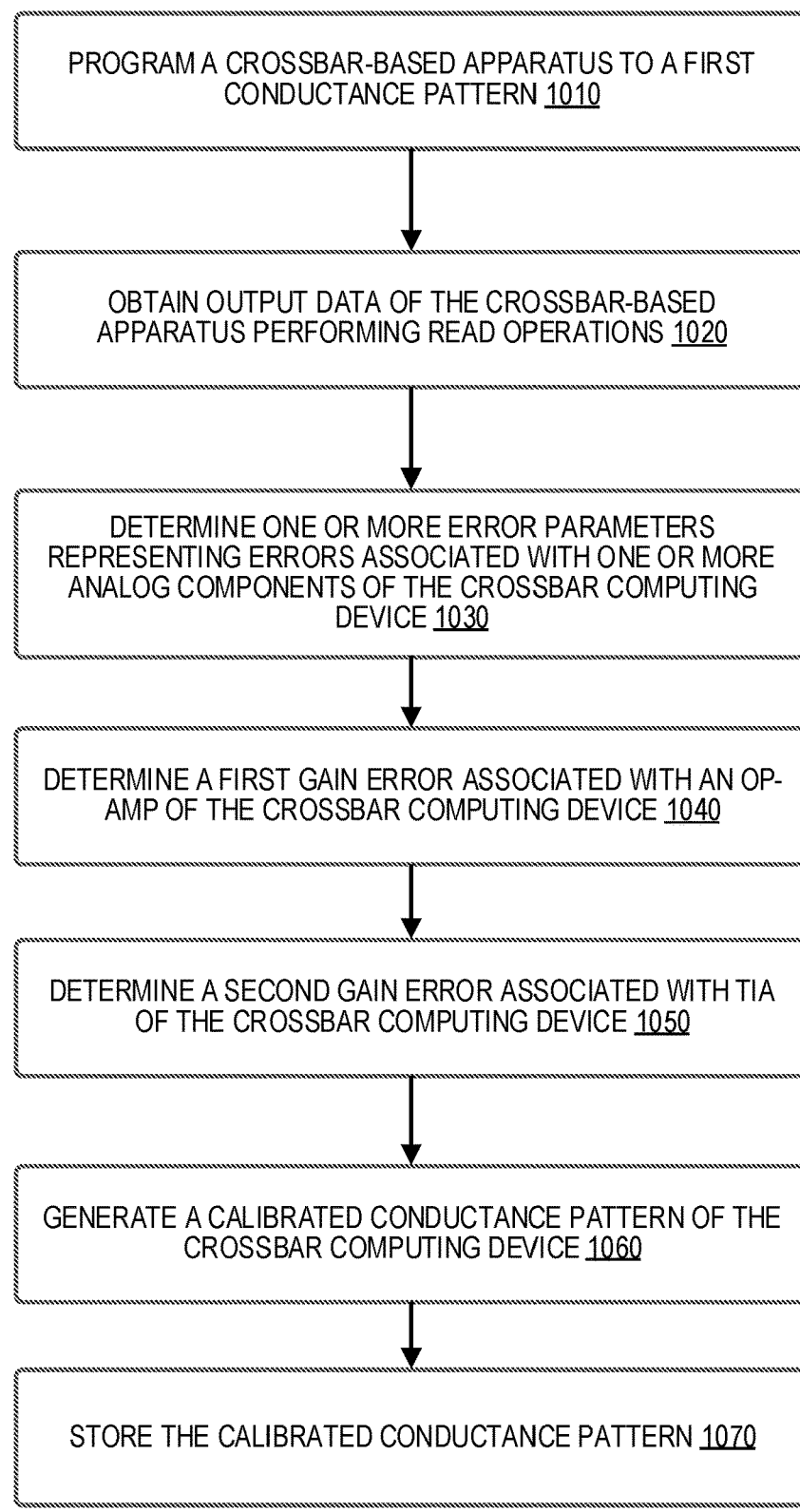
FIG. 10 is a flow diagram illustrating a method for generating a calibrated conductance pattern of a crossbar-based apparatus according to some implementations of the disclosure.

FIG. 10 is a flow diagram illustrating a method 1000 for generating a calibrated conductance pattern of a crossbar-based apparatus according to some implementations of the disclosure. Method 1000 may be performed by processing logic that comprises hardware (e.g., circuitry, dedicated logic, programmable logic, microcode, etc.), software (e.g., instructions run on a processing device to perform hardware simulation), or a combination thereof. In some embodiments, method 1000 may be implemented by a processing device executing the calibration module 340 of FIG. 3.

Method 1000 may begin at block 1010 where a crossbar-based apparatus may be programmed to a first conductance pattern.

At block 1020, a processing device may obtain output data of the crossbar-based apparatus performing read operations. The output data may include computing results of the read operations. Each of the read operations may be performed by the crossbar-based apparatus with one of a plurality of settings.

At block 1030, the processing device may determine one or more error parameters representing one or more errors associated with analog components of the crossbar-based apparatus. The error parameters may include, for example, a first error parameter corresponding to a voltage offset associated with a DAC (e.g., an error parameter approximating the difference between output voltages 423a and 423b of FIGS. 4A-4B), a second error parameter corresponding to a reference voltage associated with one or more TIAs (e.g., an error parameter approximating the difference between reference voltages 431a and 431b of FIGS. 4A-4B), a third error parameter corresponding to a reference voltage associated with one or more op-amps (e.g., an error parameter approximating the difference between reference voltages 423a and 423b of FIGS. 4A-4B), etc. The first error parameter, the second error parameter, and the third parameter may correspond to $X_1$, $X_2$, and $X_3$ in equations (6)-(7), respectively. The error parameters may be determined, for example, by performing one or more operations described in connection with FIG. 9 above.

At block 1040, the processing device may determine a first gain error associated with an op-amp of the crossbar-based apparatus. For example, the processing device may obtain an actual input voltage and an actual output voltage of the op-amp. The processing device may further determine an actual gain of the op-amp based on the actual input voltage and the actual voltage. The processing device may then determine the first gain error based on a difference between the actual gain and an expected gain of the op-amp (e.g., by fitting the actual gain to the expected gain). In some embodiments, the first gain error may correspond to $X_4$ in equations (6)-(9).

At block 1050, the processing device may determine a second gain error associated with a TIA of the crossbar-based apparatus. For example, the processing device may obtain an actual input voltage and an actual output voltage of the TIA. The processing device may further determine an actual gain of the TIA based on the actual input voltage and the actual voltage. The processing device may then determine the second gain error based on a difference between the actual gain and an expected gain of the op-TIA (e.g., by fitting the actual gain to the expected gain). In some embodiments, the second gain error may correspond to $X_5$ in equations (6)-(9).

At block 1060, the processing device may generate a calibrated conductance pattern of the crossbar-based apparatus. The calibrated conductance pattern may be generated based on the error parameters, the first gain error, the second gain error, and/or any other suitable information relating to the crossbar-based apparatus. For example, generating the calibrated conductance pattern may involve solving the conductance of the cross-point devices based on equations (6)-(9).

At block 1070, the processing device may store the calibrated conductance pattern. In some embodiments, the calibration conductance pattern may be stored in one or more circuit registers of the crossbar-based apparatus.

For simplicity of explanation, the methods of this disclosure are depicted and described as a series of acts. However, acts in accordance with this disclosure can occur in various orders and/or concurrently, and with other acts not presented and described herein. Furthermore, not all illustrated acts may be required to implement the methods in accordance with the disclosed subject matter. In addition, those skilled in the art will understand and appreciate that the methods could alternatively be represented as a series of interrelated states via a state diagram or events. Additionally, it should be appreciated that the methods disclosed in this specification are capable of being stored on an article of manufacture to facilitate transporting and transferring such methods to computing devices. The term "article of manufacture," as used herein, is intended to encompass a computer program accessible from any computer-readable device or storage media.

Figure 11:
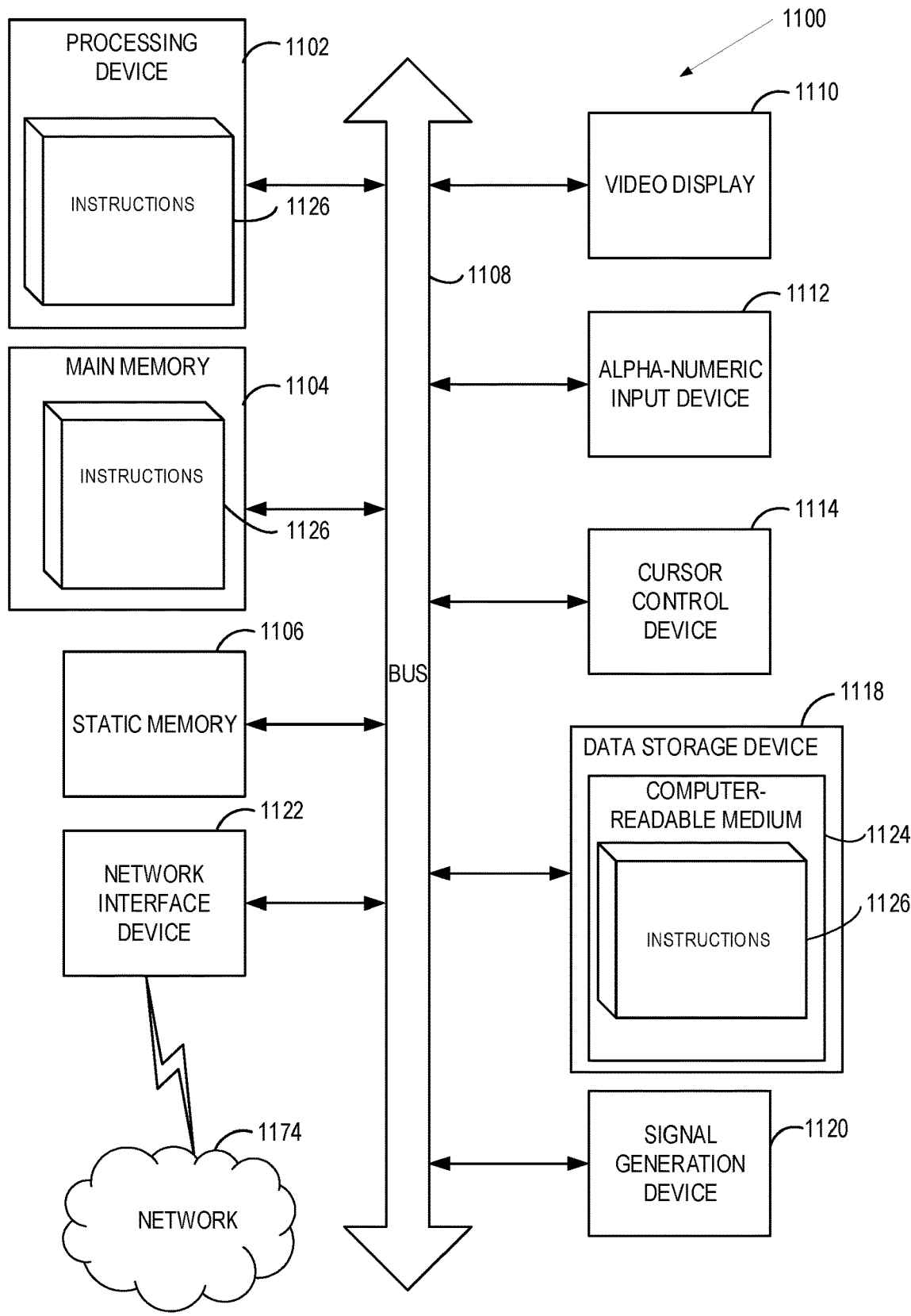
FIG. 11 is a block diagram illustrating an example of a computer system according to some implementations of the present disclosure.

FIG. 11 illustrates a diagrammatic representation of a machine in the exemplary form of a computer system 1100 within which a set of instructions, for causing the machine to perform any one or more of the methodologies discussed herein, may be executed. In alternative implementations, the machine may be connected (e.g., networked) to other machines in a LAN, an intranet, an extranet, or the Internet. The machine may operate in the capacity of a server or a client machine in client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The exemplary computer system 1100 includes a processing device (processor) 1102, a main memory 1204 (e.g., read-only memory (ROM), flash memory, dynamic random-access memory (DRAM) such as synchronous DRAM (SDRAM) or Rambus DRAM (RDRAM), etc.), a static memory 1206 (e.g., flash memory, static random-access memory (SRAM), etc.), and a data storage device 1218, which communicate with each other via a bus 1208.

Processing device 1102 represents one or more general-purpose processing devices such as a microprocessor, central processing unit, or the like. More particularly, the processing device 1102 may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device 1102 may also be one or more special-purpose processing devices such as an application specific integrated circuit (ASIC), a field programmable gate array (FPGA), a digital signal processor (DSP), network processor, or the like. The processing device 1102 is configured to execute instructions 1126 for performing the operations and steps discussed herein.

The computer system 1100 may further include a network interface device 1122. The computer system 1100 also may include a video display unit 1110 (e.g., a liquid crystal display (LCD), a cathode ray tube (CRT), or a touch screen), an alphanumeric input device 1212 (e.g., a keyboard), a cursor control device 1114 (e.g., a mouse), and a signal generation device 1120 (e.g., a speaker).

The data storage device 1118 may include a computer-readable storage medium 1124 on which is stored one or more sets of instructions 1126 (e.g., software) embodying any one or more of the methodologies or functions described herein. The instructions 1126 may also reside, completely or at least partially, within the main memory 1104 and/or within the processing device 1102 during execution thereof by the computer system 1100, the main memory 1104 and the processing device 1102 also constituting computer-readable storage media. The instructions 1126 may further be transmitted or received over a network 1174 via the network interface device 1122.

In one embodiment, the instructions 1126 include instructions for implementing a processing device for calibrating crossbar-based apparatuses, which may correspond to one or more modules of processing device 120 described with respect to FIGS. 1 and 2, and/or a software library containing methods as described in connection with FIGS. 6-10. While the computer-readable storage medium 1124 is shown in an exemplary implementation to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing, encoding or carrying a set of instructions for execution by the machine and that cause the machine to perform any one or more of the methodologies of the present disclosure. The term "computer-readable storage medium" shall accordingly be taken to include, but not be limited to, solid-state memories, optical media, and magnetic media.

In the foregoing description, numerous details are set forth. It will be apparent, however, to one of ordinary skill in the art having the benefit of this disclosure, that the present disclosure may be practiced without these specific details. In some instances, well-known structures and devices are shown in block diagram form, rather than in detail, in order to avoid obscuring the present disclosure.

Some portions of the detailed description have been presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "obtaining", "fitting", "determining", "minimizing", "updating," "reading," "setting," or the like, refer to the actions and processes of a computer system, or similar electronic computing device, that manipulates and transforms data represented as physical (e.g., electronic) quantities within the computer system's registers and memories into other data similarly represented as physical quantities within the computer system memories or registers or other such information storage, transmission or display devices.

The disclosure also relates to an apparatus for performing the operations herein. This apparatus may be specially constructed for the required purposes, or it may include a general-purpose computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or."

It is to be understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method, comprising:
    obtaining output data of a crossbar-based apparatus comprising a plurality of cross-point devices with tunable conductance, wherein the output data of the crossbar-based apparatus represents computing results of at least one operation performed by the crossbar-based apparatus, and wherein the output data corresponding to a plurality of settings of a plurality of analog components of the crossbar-based apparatus;
    obtaining, by a processing device, one or more calibration parameters based on the output data of the crossbar-based apparatus, wherein the one or more calibration parameters correspond to one or more errors associated with one or more of the analog components of the crossbar-based apparatus; and
    calibrating the crossbar-based apparatus using the one or more calibration parameters to compensate for deviations of the computing results of the at least one operation performed by the crossbar-based apparatus from expected results of the at least one operation.

2. The method of claim 1, wherein the output data of the crossbar-based apparatus corresponds to a conductance pattern of the cross-point devices, wherein the conductance pattern comprises conductance values of the cross-point devices.

3. The method of claim 1, wherein obtaining, by the processing device, the one or more calibration parameters comprises:
    determining a plurality of error parameters approximating the errors associated with the one or more of the analog components of the crossbar-based apparatus; and
    generating the one or more calibration parameters based on the error parameters.

4. The method of claim 3, wherein determining the plurality of error parameters approximating the errors associated with the one or more of the analog components of the crossbar-based apparatus comprises:
    generating simulated output data based on an error model; and
    minimizing a difference between the output data and the simulated output data.

5. The method of claim 4, wherein generating the one or more calibration parameters based on the error parameters further comprises:
    calibrating the simulated output data to generate calibrated simulated output data; and
    minimizing a difference between the calibrated simulated output data and expected output data representative of the expected results of the at least one operation performed by the crossbar-based apparatus.

6. The method of claim 5, further comprising:
    generating the simulated output data by processing input data using the error model, wherein the input data comprises the plurality of settings of the plurality of analog components of the crossbar-based apparatus.

7. The method of claim 6, further comprising:
    generating the expected output data by processing the input data using a system model.

8. The method of claim 6, wherein the input data further comprises a calibrated conductance pattern.

9. The method of claim 1, wherein the at least one operation comprises at least one of a read operation, a VMM operation, or a neural processing operation.

10. The method of claim 1, wherein the one or more errors comprise at least one of a voltage offset or a gain error.

11. The method of claim 10, wherein the plurality of analog components of the crossbar-based apparatus comprises at least one of an op-amp, an ADC, a DAC, or a TIA.

12. The method of claim 1, wherein calibrating the crossbar-based apparatus comprises: storing the calibration parameters in one or more circuit registers of the crossbar-based apparatus.

13. A system comprising:
    a memory; and
    a processing device operatively coupled to the memory, the processing device to:
        obtain output data of a crossbar-based apparatus comprising a plurality of cross-point devices with tunable conductance, wherein the output data of the crossbar-based apparatus represents computing results of at least one operation performed by the crossbar-based apparatus, and wherein the output data corresponding to a plurality of settings of a plurality of analog components of the crossbar-based apparatus;

obtain, by the processing device, one or more calibration parameters based on the output data of the crossbar-based apparatus, wherein the one or more calibration parameters correspond to one or more errors associated with one or more of the analog components of the crossbar-based apparatus; and calibrate the crossbar-based apparatus using the one or more calibration parameters to compensate for deviations of the computing results of the at least one operation performed by the crossbar-based apparatus from expected results of the at least one operation.

14. The system of claim 13, wherein the one or more errors comprise at least one of a voltage offset or a gain error, and wherein the plurality of analog components of the crossbar-based apparatus comprises at least one of an op-amp, an ADC, a DAC, or a TIA.

15. The system of claim 13, wherein, to obtain the one or more calibration parameters, the processing device is further to:

determine a plurality of error parameters approximating the errors associated with the one or more of the analog components of the crossbar-based apparatus; and generate the one or more calibration parameters based on the error parameters.

16. The system of claim 15, wherein, to determine the plurality of error parameters approximating the errors associated with the one or more of the analog components of the crossbar-based apparatus, the processing device is further to:

generate simulated output data based on an error model; and minimize a difference between the output data and the simulated output data.

17. The system of claim 16, wherein, to generate the one or more calibration parameters based on the error parameters, the processing device is further to:

calibrate the simulated output data to generate calibrated simulated output data; and minimize a difference between the calibrated simulated output and expected output data representative of the expected results of the at least one operation performed by the crossbar-based apparatus.

18. The system of claim 17, wherein the processing device is further to:

generate the simulated output data by processing input data using the error model, wherein the input data comprises the plurality of settings of the plurality of analog components of the crossbar-based apparatus.

19. The system of claim 13, wherein the at least one operation comprises at least one of a read operation, a VMM operation, or a neural processing operation.

20. A non-transitory machine-readable storage medium including instructions that, when accessed by a processing device, cause the processing device to:

obtain output data of a crossbar-based apparatus comprising a plurality of cross-point devices with tunable conductance, wherein the output data of the crossbar-based apparatus represents computing results of at least one operation performed by the crossbar-based apparatus, and wherein the output data corresponding to a plurality of settings of a plurality of analog components of the crossbar-based apparatus;

obtain, by the processing device, one or more calibration parameters based on the output data of the crossbar-based apparatus, wherein the one or more calibration parameters correspond to one or more errors associated with one or more of the analog components of the crossbar-based apparatus; and calibrate the crossbar-based apparatus using the one or more calibration parameters to compensate for deviations of the computing results of the at least one operation performed by the crossbar-based apparatus from expected results of the at least one operation.

* * * * *